United States Patent
Tsuji et al.

(10) Patent No.: US 7,106,414 B2
(45) Date of Patent: Sep. 12, 2006

(54) EXPOSURE SYSTEM AND METHOD FOR MANUFACTURING DEVICE

(75) Inventors: Toshihiko Tsuji, Saitama (JP); Yoshitomo Nagahashi, Takasaki (JP); Manabu Fujii, Natori (JP); Hironori Murakami, Sendai (JP)

(73) Assignees: Nikon Corporation, Tokyo (JP); Sendai Nikon Corporation, Natori (JP)

( * ) Notice: Subject to any disclaimer, the term of this patent is extended or adjusted under 35 U.S.C. 154(b) by 0 days.

(21) Appl. No.: 10/969,971

(22) Filed: Oct. 22, 2004

(65) Prior Publication Data

US 2005/0140946 A1   Jun. 30, 2005

Related U.S. Application Data

(63) Continuation of application No. PCT/JP03/05283, filed on Apr. 24, 2003.

(30) Foreign Application Priority Data

Apr. 24, 2002   (JP) .............................. 2002-122567

(51) Int. Cl.
  *G03B 27/42* (2006.01)
  *G03B 27/52* (2006.01)
  *G03B 27/32* (2006.01)
(52) U.S. Cl. .............................. 355/30; 355/53; 355/77
(58) Field of Classification Search .................. 355/30, 355/53, 77; 62/179, 185; 356/237.2; 250/492.1
  See application file for complete search history.

(56) References Cited

U.S. PATENT DOCUMENTS 5,974,816 A   11/1999   Endo

2002/0027645 A1   3/2002   Shiraishi

FOREIGN PATENT DOCUMENTS

| EP | 1 030 351 A1 | 8/2000 |
|---|---|---|
| JP | A 8-318103 | 12/1996 |
| JP | A 9-270384 | 10/1997 |
| JP | A 11-135429 | 5/1999 |
| JP | A 11-219902 | 8/1999 |
| JP | A 11-224848 | 8/1999 |

(Continued)

*Primary Examiner*—Peter B. Kim
(74) *Attorney, Agent, or Firm*—Oliff & Berridge PLC

(57) ABSTRACT

An exposure system is provided which can maintain a predetermined performance of the exposure apparatus stably by maintaining a cooling capacity by preventing a negative pressure from being generated in a circulation path of the liquid and preventing the back pressure from increasing even if at least a part of a temperature adjusting device is disposed under a disposition surface of the exposure apparatus due to the disposition area. A sealed tank which stores the cooling agent which is circulated in the circuiting systems and a pump, etc., which circulates the cooling agent are disposed under the disposition surface FL of the exposure system. The reticle stage and the wafer stage which are objects of which the temperature is supposed to be controlled are disposed above the disposition surface FL. A tank which open to air is provided so as to prevent the negative pressure from being generated in the reticle stage, etc. such that the tank and the tank are connected by a connecting piping arrangement. Also, the piping arrangement which eliminates the bubbles which are contained in the cooling agent which is circulated in the circulating systems are connected to the circulating systems.

21 Claims, 8 Drawing Sheets

FOREIGN PATENT DOCUMENTS

| | | |
|---|---|---|
| JP | A 2000-210503 | 8/2000 |
| JP | EP 1 041 605 A1 | 10/2000 |
| JP | A 2001-102290 | 4/2001 |
| WO | WO 99/12194 A1 | 3/1999 |
| WO | WO 99/25010 A1 | 5/1999 |
| WO | WO 00/74120 A1 | 12/2000 |
| WO | WO 03/092057 A1 | 11/2003 |

EXPOSURE SYSTEM AND METHOD FOR MANUFACTURING DEVICE

This is a Continuation of International Application No. PCT/JP03/05283 filed Apr. 24, 2003. The entire disclosure of the prior application is hereby incorporated by reference herein in its entirety.

BACKGROUND OF THE INVENTION

1. Field of the Invention

The present invention relates to an exposure system which transfers a pattern formed on a mask or a reticle onto a substrate such as a wafer, and to a method for manufacturing devices such as a semiconductor element, a liquid crystal displaying element, an image-capturing element, a thin film magnetic head, and other devices by using the exposure system.

The present application is based on Patent Application No. 2002-122567, filed in Japan, the content of which is incorporated herein by reference.

2. Description of Related Art

An exposure apparatus which transfers a pattern which is formed on a mask or a reticle (hereinafter generally referred as a mask) onto a wafer or a glass plate, etc., on which a photosensitive agent such as photoresist is applied is used in a photolithography step which is a step for manufacturing a semiconductor element, a liquid crystal displaying element, an image-capturing element, a thin film magnetic head, and other devices.

For an exposure apparatus which is used commonly in recent years, there is an exposure apparatus which employs a step and repeat method such as a reduction projection exposure apparatus (a so called stepper) and an exposure apparatus which employs a step and scan method. An exposure system employing the stepped and repeat method is an exposure apparatus which moves a wafer in a step manner and repeats a movement which transfers a pattern which is formed on a reticle onto each shot area at once. Also, an exposure system employing the step and scan method is an exposure apparatus which repeats a movement which transfers a pattern which is formed by a reticle to a shot area successively for every shot area while moving the reticle and the wafer synchronously.

In recent years, in particular, semiconductors have become highly integrated; therefore, improvement in resolution by realizing a shorter wavelength for an exposure light and by realizing a high NA (Numerical Aperture) of an optical projection system, and an improvement in an overlapping accuracy by an accurate and strict control of a baseline amount are desired. Here, a baseline amount is a distance between a reference point (for example, a center of projection) for a pattern image of the reticle which is projected on the wafer and a reference point (for example, a center of measured perspective) of an alignment sensor according to an off-axis method.

Also, an improvement in productivity is required for a production of a device in recent years. An acceleration for a reticle stage and a wafer stage increases so as to improve a through-put (number of wafers which are processed per unit time); thus, heat generated in a motor which drives these stages increases. The motor which drives the stage is disposed inside the exposure apparatus; therefore, the temperature in the exposure apparatus fluctuates to a great extent every time the exposure operation is repeated. In particular, both the wafer stage and the reticle stage are driven by a motor during an exposure operation in the exposure apparatus according to step and scan method; therefore, the temperature fluctuates to a greater extent. Here, the varies in the exposure apparatus not only due to motor which are disposed in the wafer stage and the reticle stage but also due to a driving system (for example, a lens driving system of the optical projection system and a reticle blind driving system) in the exposure apparatus are driven.

If the temperature in the exposure apparatus varies, the resolution may be reduced by variation (for example, fluctuation in the best focusing position and a variance in aberration) of the optical characteristics of the optical projection system. Also, a baseline amount may fluctuate due to thermal expansion and thermal deformation of the alignment sensor and the stages; thus, an accuracy for overlapping the projected pattern and the shot area may be reduced. In order to avoid these disadvantages, an exposing system is formed by an exposure apparatus and a temperature controlling device which maintains the temperature in the exposure apparatus. In recent years, it is common for an exposure system to be provided with a large-scale temperature controlling device which is according to a liquid cooling method in which cooling capacity is high. In such a case of preventing an increase of installation area (footprint) of the exposure system in a clean room, it is common that at least a part of the temperature controlling device is disposed under (also called "under a floor surface" or "under an installation surface" in this specification) a floor surface (an installation surface) on which the exposure apparatus is disposed.

In addition, in a case in which the temperature controlling device is disposed in the above-explained manner, an object (reticle stage, wafer stage, etc.) of which the temperature is supposed to be controlled is disposed higher than a floor surface on which the exposure apparatus is disposed, and a tank which collects the cooling medium which is circulated in the object of which the temperature is supposed to be controlled, a pump which circulates the cooling medium, and the temperature adjusting device which sets the temperature of the cooling medium are disposed under the floor surface. Therefore, the cooling medium is compressed so as to be transported by the pump to the height position of the object of which temperature is supposed to be controlled. Consequently, the cooling medium is collected in the tank after passing the object of which temperature is supposed to be controlled and falling therefrom due to a vertical positioning difference; thus, the cooling medium is compressed to be circulated in a path by the pump again.

In the controlling device which has the above-explained circulation path, the cooling medium descends after passing the object of which the temperature is supposed to be controlled; therefore, there may be a case in which a negative pressure is generated at a position of the object of which the temperature is supposed to be controlled. For example, a larte negative pressure is generated when a circulation of the cooling medium is stopped in the circulation path. When this negative pressure is generated, a case may occur in which some kinds of deformation may occur in the cooling pipe (which forms a part of the circulation path) which is disposed in the reticle stage and the wafer stage as an object of which the temperature is supposed to be controlled; thus, there may be a concern that an operation performance of the stage will be undesirably affected. As an example, in a case in which a cooling pipe is disposed in a linear motor (moving-magnet type) which drives the stage, if the cooling pipe is deformed by the negative pressure, a gap between the fixed element (coil) and the cooling pipe is unstable. As a result, the fluid amount of the cooling medium which flows in the gap is unstable; thus, temperature stability is unstable in the motor. Therefore, there are concerns that a stability of a thrust force of the motor may be unstable, or there may be a temperature distribution on a surface of the cooling pipe; thus, there is undesirable influence on accuracy for overlapping the baselines.

Also, in a case in which the temperature controlling device is disposed in the above-explained manner, it is necessary to eliminate air which remains in the circulation path so as to fill the circulation path with the cooling medium. If the pump is a large scale pump which has a high compressing performance, it is possible to raise the cooling medium to the highest position of the circulation path even if the position which supplies the cooling medium to the circulation path and the position for eliminating the air are lower than the highest position of the circulation path. Therefore, it is possible to eliminate the air from the circulation path so as to fill the circulation path with the cooling medium there.

On the other hand, in a case in which a small pump must be used due to a limitation such as that due to an installation area, a method is used which supplies the cooling medium from a vicinity of the highest position of the circulation path into the circulation path and eliminating the air from the vicinity of the highest position of the circulation path so as to fill the circulation path with the liquid (the cooling medium) by gravity and only so as to use the pump as a circulating capacity. However, air cannot necessarily be removed from the highest point of the circulation path if this method is used; therefore, there may be a case in which it is not possible to eliminate air in the circulation path completely. Moreover, there is a case in which air remains there for unknown reasons. If air remains in the circulation path, a back pressure is generated in the circulation path; therefore, if a small pump is used which does not have a sufficient compressing capacity so as to resist the force of air which ascends upwardly, there is a concern that a cooling capacity for the stage may be reduced because it is no possible to flow a desirable fluid amount in the circulation path as a result. In addition, there is a concern that an operability performance of the stage may be reduced. Also, quite often, a cooling pipe which does not have a high pressure resistance from a space point of view is used for a linear motor, etc.; thus, there is a problem in that it is not possible to increase the fluid amount of the liquid when the back pressure increases in the circulation path.

SUMMARY OF THE INVENTION

The present invention was made in consideration of the above problems. An object of the present invention is to provide an exposure system and a method for manufacturing a device by using the exposure system which can maintain a desirable performance by stabilizing a performance of the exposure system so as to improve an efficiency for manufacturing the device as a result by maintaining the cooling capacity by preventing the generation of the negative pressure in the circulation path for the liquid (cooling medium) and the increase of the back pressure even in a case in which at least a part of the temperature adjusting device is disposed under an installation surface of the exposure apparatus due to a limitation of the installation area.

In order to solve the above problems, in a first aspect of the present invention, an exposure system which is provided with an exposure system which projects and transfers an image of a reticle held on a reticle stage onto a substrate held onheld on a a substrate stage through an optical projection system, the system includes a circulating device which is disposed under an installation surface of the exposure apparatus and circulates a liquid to an object through a circulation pipe so as to control a temperature for at least said reticle stage, said substrate stage, and said projection optical system, and a tank which contains the liquid thereinside, and is disposed higher than the installation surface of the exposure apparatus, and is connected along a path through which the liquid is directed from the object to the circulating device in the circulation path of the liquid through a first piping arrangement.

According to the present invention, it is possible to prevent the generation of the negative pressure in the circulation path of the liquid even in a case in which at least a part of the temperature adjusting device is disposed under the installation surface on which the exposure apparatus is disposed because the tank which is disposed higher than the installation surface on which the exposure apparatus is disposed is connected to an intermediate section in a path which is directed from the object to the circulation device through the first piping arrangement; thus, a pressure of the liquid is applied to a vicinity of an upstream of the circulating device according to a height position of the tank.

Here it is preferable that the tank be a tank which is open to the atmosphere, and the height of the surface of the liquid in the tank with reference to the installation surface is set between the height position of the reticle stage and the height position of the substrate stage.

In order to solve the above problems, in a second aspect of the present invention, the exposure system which is provided with an exposure system which projects and transfers an image of a reticle held on a reticle stage on a substrate which is held on a substrate stage through an optical projection system includes a circulating device which is disposed under an installation surface of said exposure apparatus and circulates a liquid to an object through a circulation pipe so as to control a temperature for at least said reticle stage, said substrate stage, and said optical projection system, a first sealed tank which contains the liquid thereinside, and is disposed under an installation surface of the exposure apparatus, and is disposed in a path through which the liquid is directed from the object to the circulating device in the circulation path of the liquid through a first piping arrangement, and a second tank which contains the liquid thereinside and is disposed higher than an installation surface of the exposure apparatus and is connected to the first tank through the first piping arrangement.

According to the present invention, an airtight first tank is disposed in the path which is directed from the object to the circulating device under the installation surface on which the exposure apparatus is disposed, and a second tank is disposed higher than the installation surface on which the exposure apparatus is disposed such that the second tank and the first tank are connected through a first piping arrangement. In a case of such a structure, a great amount of negative pressure is generated because there is a great amount of vertical difference between the object and the first tank. The second tank which is disposed higher than the installation surface and the first tank which is disposed under the installation surface are connected through the first piping arrangement. Therefore, a great amount of pressure which corresponds to the vertical difference between the second tank and the first tank is applied on the tank (in the side of an upstream of the circulating device); thus, it is possible to prevent the generation of the negative pressure in the circulation path of the liquid similarly to a case of the exposure system according to the first aspect.

Here, in the exposure system according to the above-explained first aspect and the exposure system according to the above-explained second aspect, it is preferable that the circulation pipe and the first piping arrangement be formed of a material member in which a fluctuation of volume with reference to a pressure is smaller than a predetermined value.

In order to solve the above problems, in a third aspect of the present invention, an exposure system which is provided with an exposure system which projects an image of a reticle held on a reticle stage on a substrate which is held on a substrate stage through an optical projection system and is transferred thereon includes a circulating device which is disposed under an installation surface of said exposure apparatus and circulates a liquid to an object through a circulation pipe so as to control a temperature for at least said reticle stage, said substrate stage, and said optical projection system, and a removing pipe which is connected to an inside of a path through which the liquid is directed from the object to the circulating device in the circulation path of the liquid so as to remove the bubbles (ex. air) which are contained in the liquid which is circulated in the circulating device.

According to the present invention, a removing pipe is connected to the circulation path so as to remove the bubbles contained in the liquid. Therefore, if the circulating device performs a circulating operation for the liquid, the liquid which contains the bubbles and circulates in the circulation path flows into the pipe naturally; thus, the bubbles which are contained in the liquid are automatically removed merely by performing the circulating operation of the liquid. Such an operation is maintained during circulation of the liquid in the circulation path; therefore, it is possible to reduce the back pressure which is caused by the bubbles (ex. the air) which are contained in the liquid as time (number) for circulating the liquid goes by. Finally, it is possible to completely eliminate the back pressure which is caused by the air.

In order to solve the above problems, in a fourth aspect of the present invention, an exposure system which is provided with an exposure system which projects an image of a reticle held on a reticle stage on a substrate which is held on a substrate stage through an optical projection system and transfers thereon includes a circulating device which is disposed under an installation surface of said exposure apparatus and circulates a liquid to an object through a circulation pipe so as to control a temperature for at least said reticle stage, said substrate, and said optical projection system, a tank which is open to the atmosphere which contains the liquid thereinside, and is disposed higher than an installation surface of the exposure apparatus, and is connected along of a path through which the liquid is directed from the object to the circulating device in the circulation path of the liquid through a first piping arrangement, and a detecting section which detects a position of a surface of the liquid which is contained in the tank.

According to the present invention, a tank which is open to the atmosphere is provided. By doing this, it is possible to reduce the fluctuation of the surface of the liquid even if there is a fluctuation of volume which is caused by a pressure in the piping arrangement. As a result, it is possible to monitor the fluctuation of the surface of the liquid; thus, it is possible to improve the reliability without the liquid leaking.

Here, in an exposure system according to any one of the above first aspect to the fourth aspect, it is preferable that the exposure system further include a first temperature adjusting device which is disposed under the installation surface and supercools down the liquid lower than a predetermined temperature or superheats the liquid higher than the predetermined temperature of the liquid, and a second temperature adjusting device which is disposed under an installation surface and nearer the object than the first temperature adjusting device on a path through which the liquid is directed to the object in the circulation path and adjusts the temperature of the liquid of which temperature is adjusted by the first temperature adjusting device at the predetermined temperature.

In the above exposure system, it is possible to prevent occurrence of negative pressure and increase in back pressure in the circulation path of the liquid; thus, a cooling capacity is maintained so as to stabilize a performance of the exposure system at a desirable performance level. As a result, it is possible to improve an efficiency for manufacturing the devices.

BRIEF DESCRIPTION OF THE DRAWINGS

FIG. 6A shows an example for a connection in which the tank 81 is small. FIG. 6B shows an example for a connection in which the tank 81 is large.

DETAILED DESCRIPTION OF THE INVENTION

Figure 1:
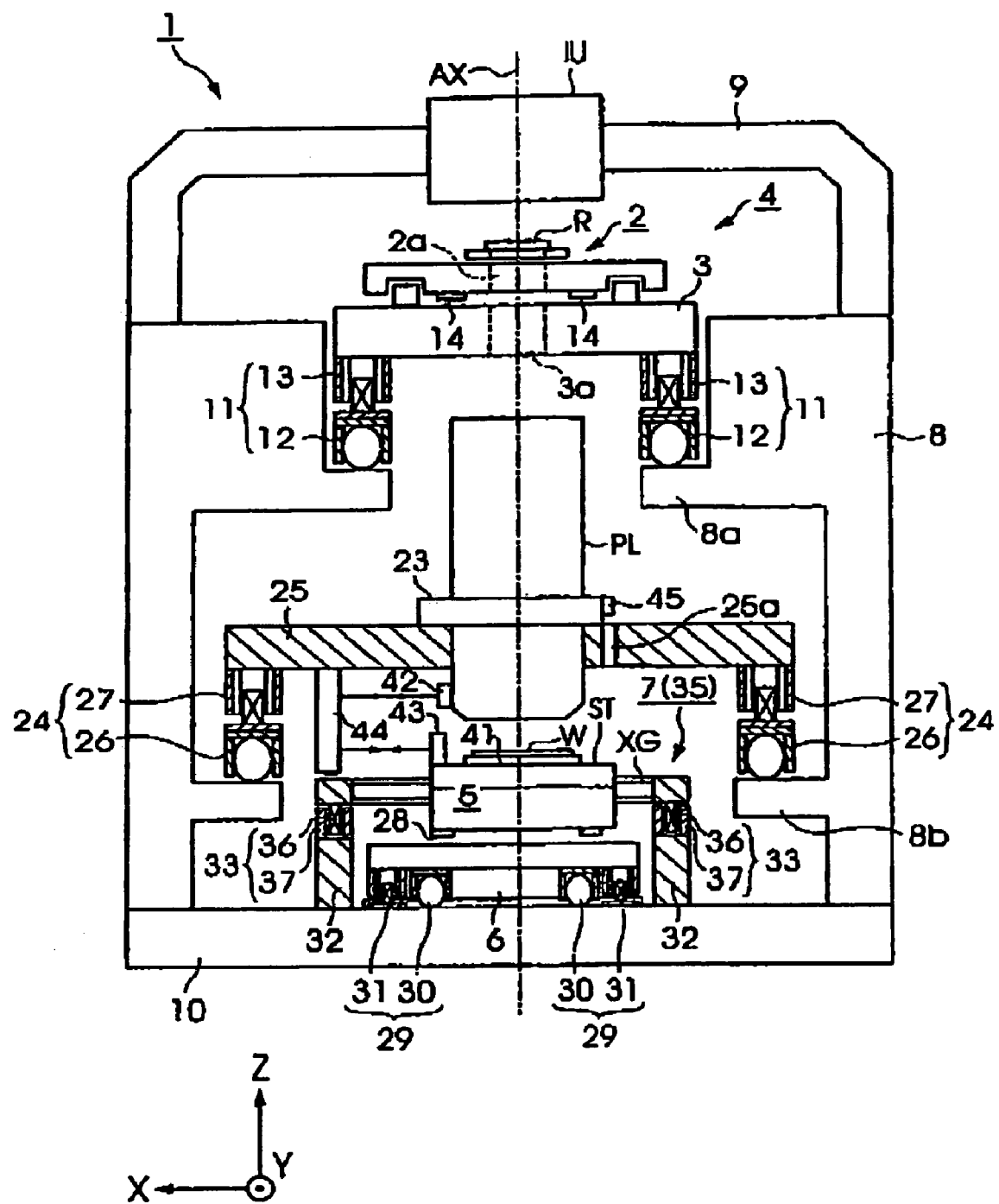
FIG. 1 is a view showing a general structure of an exposure system which is provided in an exposure apparatus according to an embodiment of the present invention.

An exposure system and a method for manufacturing a device according to an embodiment of the present invention are explained with reference to drawings below. FIG. 1 is a view showing a general structure of an exposure system which is provided in an exposure apparatus according to a first embodiment of the present invention. The present embodiment is explained with reference to an example in which the present invention is applied to an exposure system according to a step and scan method which manufactures a semiconductor element by transferring a pattern which is formed on a reticle R onto a wafer W while moving the reticle R as a mask and the wafer W relative to an optical projection system PL.

Here, explanations are made as follows in which an XYZ orthogonal coordinate system which is shown in FIG. 1 is set so as to explain a positional relationship of each members with reference to this XYZ orthogonal coordinate system. In the XYZ orthogonal coordinate system, the X axis and the Y axis are set so as to be in parallel to the wafer W and the Z axis is set in an orthogonal direction (a direction which is disposed along an optical axis AX of the optical projection system PL) to the wafer W. In the XYZ coordinate system in the drawings, an XY plane is set so as to be parallel with a horizontal surface and the Z axis is set in a vertical upward direction actually. Also, a direction (scanning direction) in which the reticle R and the wafer W are moved during exposure to a light (during transfer of patterns) is set as a Y direction in the present embodiment. Here, rotational directions around each axes are θZ, θY, and θX respectively.

For a general structure, the exposure system 1 which is shown in FIG. 1 is formed by a lighting optical system IU, a stage device 4, an optical projection system PL, a stage device 7, and a reaction frame 8. The lighting optical system IU lights a rectangular (or arc-shaped) lighting area on the reticle R as a mask by a uniform illumination degree by a lighting light for exposure from a light source (not shown in the drawing). The stage device 4 is formed so as to contain a reticle stage 2 as a mask stage which supports and moves the reticle R and a reticle plate 3 which supports the reticle stage 2. The optical projection system PL projects a pattern which is formed on the reticle R on the wafer W as a substrate by a reduction ratio of 1/α (for example, α is 5 or 4). The stage device 7 is formed by the wafer stage 5 which supports and moves the wafer W as a stage for the substrate and the wafer plate 6 which supports the wafer stage 5. The reaction frame 8 supports the above-explained stage device 4 and the optical projection system PL.

The lighting optical system IU is supported by a supporting column 9 which is fixed on an upper surface of the reaction frame 8. Here, for example, a bright line in an ultraviolet range (g line, i line) which is emitted from a super high pressure mercury lamp, a deep ultra-violet ray (DUV ray) such as a KrF excimer laser light (wavelength 248 nm), ArF excimer laser light (wavelength 193 nm), or a vacuum ultraviolet ray (VUV) such as a $F_2$ laser light (wavelength 157 nm) are used for the lightning light for exposure. The reaction frame 8 is disposed on the base plate 10 which is mounted on a floor surface horizontally such that step sections 8a and 8b which protrude inwardly thereat are formed on an upper surface and a bottom surface respectively.

The reticle plate 3 which forms a part of the stage device 4 is supported horizontally at the step section 8a of the reaction frame 8 through an anti-vibration unit 11 such that an aperture 3a is formed trough which a pattern image is formed on the reticle R in a central section. Here, only the anti-vibration unit 11 which is disposed in the X direction is shown in FIG. 1; thus, the anti-vibration unit which is disposed in the Y direction is omitted in the drawing.

Here, it is possible to use a ceramic member for a material member for the reticle plate 3. In the anti-vibration unit 11, an air mount 12 of which the inner pressure can be adjusted and a voice coil motor 13 are disposed on the step section 8a in a linear manner. A micro-G level (G indicates gravitational acceleration) of slight vibration which is about to be transferred to the reticle plate 3 through the base plate 10 and the reaction frame 8 is blocked by these anti-vibration units 11.

The reticle stage 2 is supported on the reticle plate 3 along the reticle plate 3 movably in a two-dimensional manner. A plurality of air bearings (air pads) 14 are fixed on a bottom surface of the reticle stage 2 such that the reticle stage 2 is supported by these air bearings 14 in a floating manner with several microns of clearance on the reticle plate 3. Also, an aperture 2a is formed in a central section of the reticle stage 2 such that the aperture section 2a should communicate with the aperture 3a of the reticle plate 3 and a pattern image of the reticle R passes trough the aperture 2a.

Figure 2:
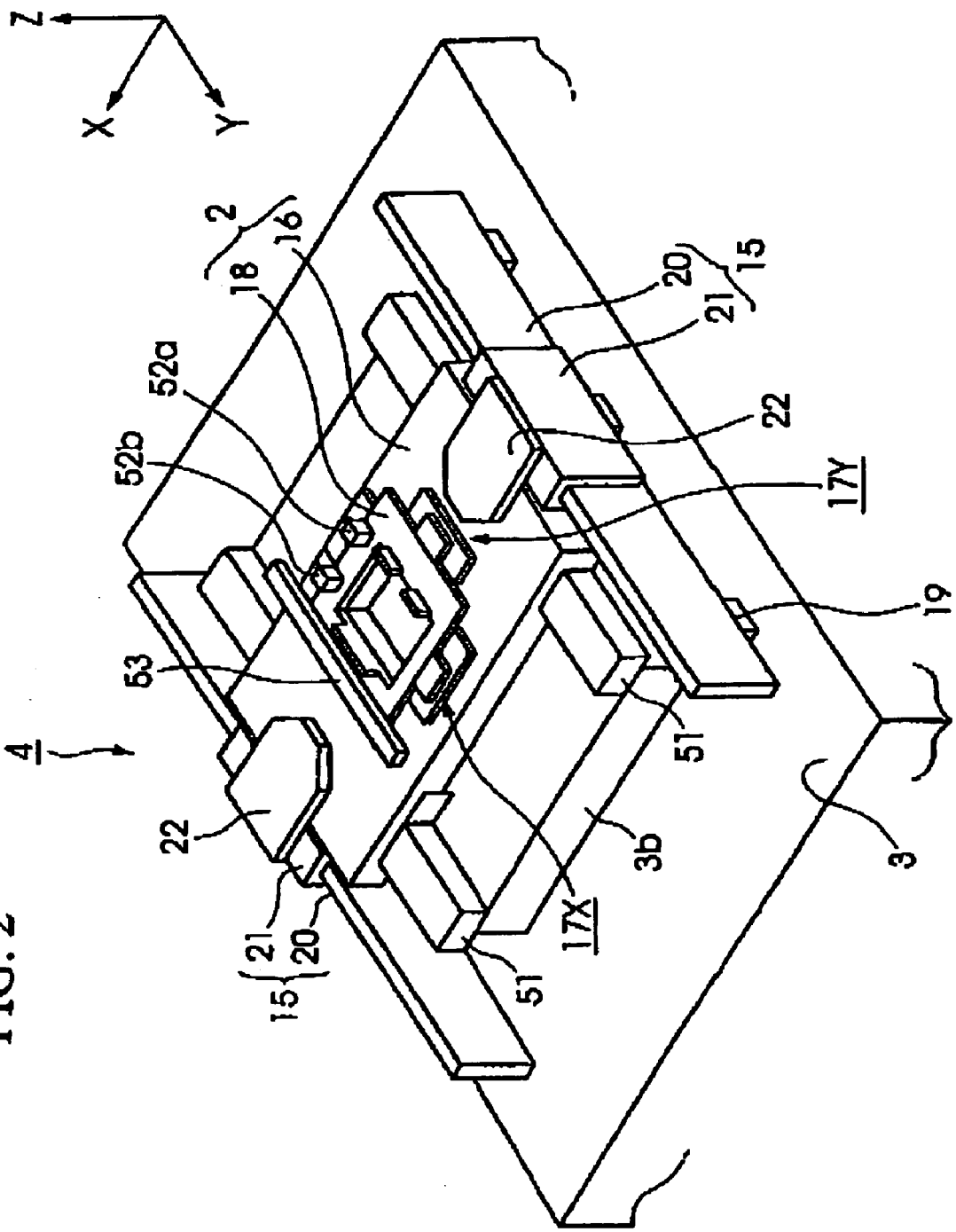
FIG. 2 is a perspective view showing a general structure of a reticle stage which is provided in the exposure system which is provided in the exposure apparatus according to an embodiment of the present invention.

Here, the reticle stage 2 is explained in detail. FIG. 2 is a perspective view for showing a general structure of a reticle stage which is provided in the exposure system which is provided in the exposure system according to an embodiment of the present invention. As shown in FIG. 2, the reticle plate 2 is provided with a reticle rough motion stage 16 which is driven by a pair of Y linear motor (driving source) 15 by a predetermined stroke on the reticle plate 3 and a reticle fine motion stage 18 which is driven by a pair of X voice coil motors (driving source) 17 and a pair of Y voice coil motors (driving source) 17Y in X, Y, and θZ directions in a fine movement. The reticle stage 2 is formed by the reticle rough motion stage 16 and the reticle fine motion stage 18 in such a way. However, the reticle stage 2 is shown in FIG. 1 in a simplified manner.

Each Y linear motor 15 is provided with a fixed element 20 which is supported by a plurality of non-contacting air bearings (air pads) 19 on the reticle plate 3 in a floating manner and extends in the Y axis direction and a movable element 21 which is fixed on the reticle rough motion stage 16 via a connecting member 22 so as to correspond to the fixed element 20. Therefore, the fixed element 20 moves in a −Y direction as a counter mass according to a movement of the reticle rough motion stage 16 in +Y direction according to a theory of conservation of linear momentum.

It is possible to set off a reaction force which accompanies the movement of the reticle rough motion stage 16 by moving this fixed element 20; also, it is possible to prevent the barycentric position from varying. Here, the movable element 21 and the fixed element 20 in the Y linear motor 15 are coupled; therefore, if these members move relative to each other, a force which lets these members remain there is applied there. Therefore, a trim motor which compensates for a movement amount of the fixed element 20 which intends to reach a predetermined position is disposed in the present embodiment.

The reticle rough motion stage 16 is guided in the Y axis direction by a pair of Y guides 51 and 51 which are fixed on an upper surface of n upper protruding section 3b which is formed in a central section of the reticle plate 3 and extend in the Y axis direction. Also, the reticle rough motion stage 16 is supported by the air begin which are not shown in the drawing so as to face these Y guides 51 and 51 in a non-contacting manner.

The reticle R is supported on the reticle fine motion stage 18 which chucks the reticle R via a vacuum chuck which is not shown in the drawing. A pair of Y moving mirrors 52a and 52b which are formed by a corner cube are fixed on an end section in −Y direction of the reticle fine motion stage 18. Also, an X moving minor 53 which is formed by a plane mirror and extends in the Y axis direction is fixed on an end section of +X direction of the reticle fine motion stage 18. Consequently, three laser interferometers (none of which are shown in the drawing) which emit a wavelength measurement beam to these Y moving mirrors 52*a* and 52*b,* and X moving mirror 53 measure distances from each of the moving mirrors. By doing this, positions of the reticle stage 2 in the X direction and the Y direction, and a rotation angle θZ and the Z axis are measured with high accuracy.

Referring to FIG. 1 again, the optical projection system PL contains a plurality of refractive optical elements (lens elements) such that both an objective surface (reticle R) and an image surface (wafer W) have telecentric circular projection perspectives. For a nitriding member for a plurality of lens elements which are provided in the optical projection system PL, for example, a silica or a fluorite is selected according to the wavelength of the lighting light for exposure. When a light which is emitted from the lighting optical system IU is emitted on the reticle R, the lighting light which passes through the reticle R is incident into the optical projection system P1 such that an inverted image of a part of a pattern which is formed on the reticle is focused in a center of a circular perspective near the image surface of the optical projection system PL in a limited slit manner. By doing this, the inverted image of a part of the projected pattern is transcribed on a resist layer on a surface of a shot area among a plurality of shot areas on the wafer W which is disposed on a focusing surface of the optical projection system PL in a contracted manner.

A pattern (for example, five lens element) of the lens element (which forms the optical projection system PL) which is disposed in the lens element PL is movable in the optical axis AX direction (Z direction) by a driving source such as an actuator which uses a piezo-electric element, a magnetostriction actuator, and a fluidic pressure actuator, etc., and in a freely tilting manner around the X direction or the Y direction. For example, five rotational symmetric aberrations and five decentralized aberrations can be compensated individually by adjusting a position of one of the lens elements which can be moved and tilted or by adjusting positions of a plurality of lens elements by correlating each position of the lens element. Here, five rotational symmetric aberrations may be named such as a magnification, a distortion (distortion aberration), a coma aberration, a field curvature abberation, and a spherical aberration. Also, four decentralized aberrations may be named such as a decentralized distortion (distortion aberration), a decentralized coma aberration, a, a decentralized asymmetric aberration, and a decentralized spherical aberration.

The optical projection system PL is inserted into a plate 25 for mirror cylinder which is formed by a cast member which is supported by a step section 8*b* of a reaction frame 8 approximately horizontally via an anti-vibration unit 24 such that an optical axis AX direction is a Z direction. Simultaneously, a flange 23 is engaged with the optical projection system PL. Here, the anti-vibration units 24 are disposed at each corner of the plate 25 for a mirror cylinder such that the air mount 26 of which inner pressure is adjustable and the voice coil motor 27 are disposed on the step section 8*b* in a linear manner. Here, only the anti-vibration unit 24 which is disposed in the X direction is shown in FIG. 1; thus, the anti-vibration unit which is disposed in the Y direction is omitted in the drawing. A micro-G level (G indicates gravitational acceleration) of slight vibration which is about to be transferred to the plate 25 for a mirror cylinder via the base plate 10 and the reaction frame 9 is blocked by these anti-vibration units 24.

The stage device 7 is provided mainly with a wafer stage 5, a wafer plate 6 which supports this wafer stage 5 such that the wafer stage 5 can be moved in a two-dimensional direction along the XY plane, a stand ST for a sample which is disposed unitarily with the wafer stage 5 and absorbs and supports the wafer W, and an X guide bar XG which supports the wafer stage 5 and the stand ST for a sample relatively movable. A plurality of air bearing (air pads) 28 are fixed on a bottom surface of the wafer stage 5 such that the wafer stage 5 is supported by these air bearing 28 in a floating manner with several microns of clearance on the wafer plate 6.

The wafer plate 6 is supported above the base plate 10 approximately horizontally via the anti-vibration unit 29. Here, the anti-vibration units 29 are disposed at each corner of the wafer plate 6 such that the air mount 30 of which inner pressure is adjustable and the voice coil motor 31 are disposed on the base plate 10 in a serial manner. Here, only the anti-vibration unit 29 which is disposed in the X direction is shown in FIG. 1; thus, the anti-vibration unit which is disposed in the Y direction is omitted in the drawing. A micro-G level of slight vibration which is about to be transferred to the wafer plate 6 via the base plate 10 is blocked by these anti-vibration units 29.

Figure 3:
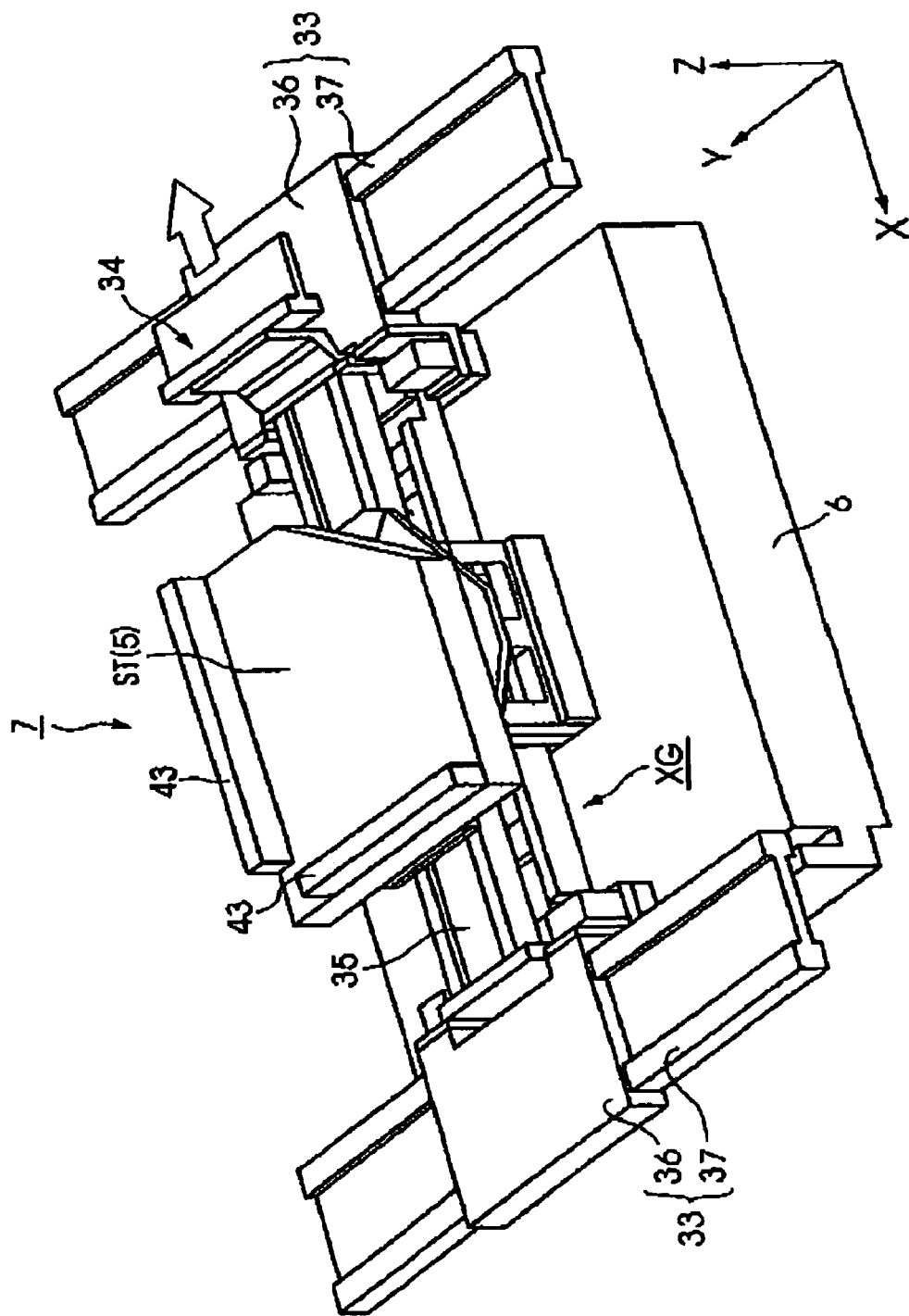
FIG. 3 is a perspective view showing a general structure of a wafer stage which is provided in the exposure system which is provided in the exposure apparatus according to an embodiment of the present invention.

Here, the wafer stage 5 is explained in detail. FIG. 3 is a perspective view for showing a general structure of a wafer stage which is provided in the exposure system which is provided in the exposure system according to an embodiment of the present invention. As shown in FIG. 3, the X guide bar XG has a long bar shape along the X direction such that the movable elements 36 and 36 which are formed by armatures are disposed on both ends of its longitudinal direction. The fixed elements 37 which have magnetic units which correspond to these movable element 36 and 36 are disposed in the supporting sections 32 which are disposed so as to protrude therefore (see FIG. 1. Here, the movable element 36 and the fixed element 37 are shown in FIG. 1 in a simplified manner).

The linear motors (driving source) 33 are formed by the movable element 36 and the fixed element 37. The X guide bar XG moves in the Y direction by driving the movable element 36 by making use of an electromagnetic interaction between the movable element 36 and the fixed element 37; thus, a rotational movement is realized in the θZ direction by adjusting the driving operation of the linear motors 33. That is, the wafer stage 5 (and the stand for a sample ST, which is called a stand for a sample ST for short hereinafter) is driven in the Y direction and the θZ direction approximately unitarily with the X guide bar XG by this linear motor 33.

Also, the movable element of the X trim motor 34 is disposed at an minus end of the X direction of the X guide bar XG. The X trim motor 34 serves for adjusting the position of the X guide bar XG in the X direction by generating a thrust force in the X direction such that its fixed element (not shown in the drawing) is disposed on the reaction frame 8. Therefore, the reaction force for driving the wafer stage 5 in the X direction is transmitted to the base plate 10 via the reaction frame 8.

The stand for a sample ST is supported and held via a magnetic guide which is formed by a magnet which maintains a predetermined amount of gap in the Z direction and an actuator between the X guide bar XG so as to be relatively movable in the X direction and so as to be non-contacting with the X guide bar XG. Also, the wafer stage 5 is driven in the X direction by an electromagnetic interaction of the X linear motor (driving source) 35 which has a fixed element which is embedded in the X guide bar XG. Although it is not shown in the drawing, the movable element of the X linear motor is attached to the wafer stage 5. The wafer W is fixed on an upper surface of the stand for a sample ST via a wafer holder 41 according to a vacuum absorbing method, etc. (not shown in FIG. 3. See FIG. 1).

Here, the X linear motor 25 is disposed nearer to the wafer W which is mounted on the wafer stage 5 than the above linear motor 33 as a driving source. In addition, the movable element of the linear motor is fixed on the stand for a sample ST. Therefore, it is preferable in the X linear motor 35 that a moving magnet type linear motor be used in which a coil which is a heat source serves as a fixed element for from the wafer W so as not to be fixed on the sample stand ST directly. Also, the linear motor 33 requires a far greater thrust force than that of the X linear motor 35 because the linear motor 33 has to drive the X linear motor 35, an X guide bar XG, and the stand for a sample ST unitarily. Therefore, the linear motor 33 requires a great amount of electricity; thus, an amount of the generated heat is greater than that of the X linear motor 35. Therefore, it is preferable that a moving coil type linear motor be used for the linear motor 33. However, it is necessary to circulate a cooling medium (liquid) in the movable element 36 in the moving coil type linear motor; therefore, if there is a disadvantage from a device point of view, it is acceptable to use a moving magnet type linear motor in which a magnet is disposed near the movable element 36.

The position of the wafer stage 5 in the X direction is measured in real time by a predetermined resolution such as approximately 0.5 to 1 nm resolution by a laser interferometer 44 which measures a variance in position of the fixed element moving mirror 43 which is fixed in a part of the wafer stage 5 as shown in FIG. 1 with reference to a reference mirror (see FIG. 1) which is fixed in a bottom end of a cylinder of the optical projection system PL. Here, the position of the wafer stage 5 in the Y direction is measured by X above explained reference mirror 42, a reference mirror which is not shown in the drawing but is disposed so as to be orthogonal to the laser interferometer 44, a laser interferometer and the moving mirror 43. At least a laser interferometer is a multi-axes interferometer which has at least two axes of wavelength measuring axes so as to measure not only positions in the X direction and the Y direction of the wafer stage 5 (in addition, the wafer W) according to the measured value by the laser interferometer but also a rotational amount θ and a leveling amount.

Furthermore, as shown in FIG. 1, three sets of laser interferometers 45 are fixed at these different points on the flange 23 of the optical projection system PL (here, one of these laser interferometers is shown in FIG. 1 representatively). Apertures 25$a$ are formed in a part of the plates 25 for mirror cylinder which face each laser interferometer 45 such that the laser beam (wavelength measuring beam) in the Z direction is emitted from each of the laser interferometers 45 to the wafer plate 6. A reflecting surface is formed in a position which faces the wavelength measuring beam on an upper surface of the wafer plate 6. Therefore, three different Z positions on the wafer plate 6 are measured by the above-explained three laser interferometers 45 with reference to the flange 23.

Figure 4:
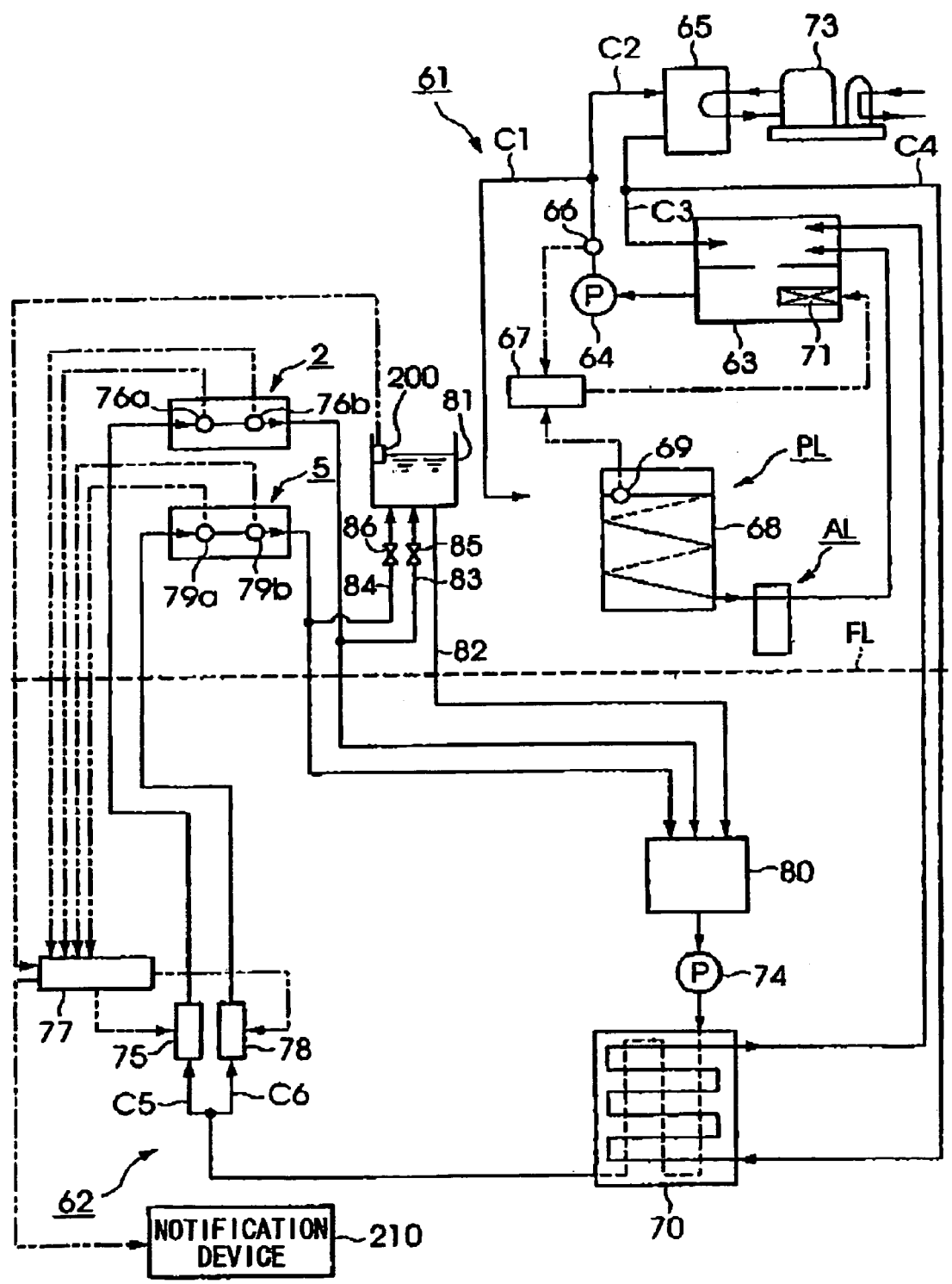
FIG. 4 is a view showing a structure of a temperature controlling device which is provided in an exposure apparatus according to an embodiment of the present invention.

Next, a temperature controlling device which is provided in the exposure system according to the present embodiment is explained. FIG. 4 is a view for showing a structure of a temperature controlling device which is provided in an exposure system according to an embodiment of the present invention. The temperature controlling device which is shown in FIG. 4 can be categorized in general categories such as a first controlling system 61 which performs a temperature controlling operation and a managing operation for a controlled object such as the optical projection system PL and the alignment system AL by using the cooling medium (liquid) and a second controlling system 62 which performs a temperature controlling operation and a managing operation for a controlled object such as the reticle stage 2 and the wafer stage 5 by using the cooling medium (liquid) independently from the first controlling system 61.

Here, the first controlling system 61 and the second controlling system 62 are disposed in separate casings (not shown in FIG. 4) respectively. In this way, the optical projection system PL and an alignment system AL in which an amount of the generated heat and a variation amount of temperature are in a predetermined amount and the reticle stage 2 and the wafer stage 5 in which an amount of the generated heat and a variation amount of temperature are greater than the predetermined amount are controlled separately in the present embodiment. Here, it is possible to use an HFE (hydro-fluro-ether), Fluorinert, and a water (pure water) for a cooling agent for adjusting the temperature. In the present embodiment, the HFE is used of which global warming potential is low and ozone-depeting potential is zero from a global environmental protection point of view.

The cooling agent in a tank 63 of which temperature is controlled in the first controlling system 61 is divided into a circulating system C1 which circulates the optical projection system PL and the alignment system AL successively and a cooling system C2 which is cooled by an evaporator 65 after passing the pump 64. The temperature of the cooling agent immediately after being emitted from the pump 64 is detected by the temperature sensor 66 so as to be outputted to a controller 67. With regards to the circulating system C1, a piping arrangement is disposed around the cylinder 68 in the optical projection system PL; by doing this, a great range for adjusting temperature by the cooling agent is set. In the present embodiment, in FIG. 4, the cooling agent is circulated around the cylinder 68 spirally downwardly. However, the structure of the present embodiment is not limited to this condition; thus, it is acceptable if the circulation is performed spirally upwardly.

Also, a temperature sensor 69 is disposed so as to detect the temperature of the cooling agent before the cooling agent is circulated in the optical projection system PL in this circulating system C1. The result of the detection is outputted to the controller 67. Here, the piping arrangement is disposed around an entire surface of the cylinder 68 spirally so as to adjust the temperature of the optical projection system PL in the present embodiment as explained above. However, the present invention is not limited to this condition; thus, it is acceptable for the piping arrangement to be disposed at a part of a member (flange 23) which supports the optical projection system PL so as to adjust the temperature (flange temperature adjusting method).

Alignment sensors which are according to an LSA (Laser Step Alignment) method, an FIA (Field Image Alignment) method, or an LIA (Laser Interferometric Alignment) method can be used for an alignment system AL of an Off-Axis system. A laser beam such as He-Ne is emitted on an alignment mark in a dot array condition on the wafer W such that a detracted beam or a scattered beam by the mark is used for detecting a position of the mark in the LSA method. Also, a light of which wavelength bandwidth is wide is emitted from a light source such as a halogen lamp such that an image of the alignment mark of which image is captured by a CCD camera is processed so as to measure a position of the mark in the FIA method.

Furthermore, two coherent beams (such as semiconductor lasers, etc.) which are slanted symmetrically in a pitch direction are emitted to an alignment mark under a grating condition on the wafer W such that two generated refracted beams should interfere so as to measure a position of the alignment mark from its phase in the LIA method. Here, it is possible to use an alignment sensor which employs a method which is disclosed in WO98/39689 in which a light for detecting an alignment (He—Ne or YAG laser beam, etc.) is emitted vertically to an alignment mark on the wafer so as to detect a refracted beam which has the same order as generated from the mark. It should be understood that an alignment sensor according to the FIA method is used in the present embodiment among the above methods.

A cooling agent is circulated in the alignment system AL and the alignment light source so as to adjust the temperature in the circulating system C1. It is possible to employ a circulating method in which a piping arrangement is disposed in a casing which contains a light source spirally similarly to a case of, for example, the optical projection system PL. Here, it is acceptable that the cooling agent be circulated not only in the alignment light source but also in the casing which contains the alignment optical system so as to control the temperature in the alignment system AL. Also, it is possible to perform an adjustment of the temperature by circulating the cooling agent in the alignment light source and the casing according to a TTR (Through The Reticle) method in which a mark is detected on the wafer W through the optical projection system PL and a TTL (Through The Lens) method instead of the Off-Axis system. The cooling agent which is circulated in the alignment system AL and the optical projection system PL in the circulating system C1 returns to an upper chamber of the tank 63 which is segmented such that an upper stage and a bottom stage should communicate with each other.

On the other hand, the cooling agent in the cooling system C2 is divided into a path C3 which returns to the upper chamber of the tank 63 after being cooled in the evaporator 65 and a path C4 which is directed to a heat exchanger 70 as a first temperature adjusting device. Here, the evaporator 65 is cooled by a refrigerator 73 which circulates a gaseous cooling agent. The cooled cooling agent is used for exchanging a heat in the heat exchanger 70 as the first temperature adjusting device in the path C4. After that, the cooling agent returns to the upper chamber of the tank 63 so as to be cooled again. A heater 71 which is controlled by the controller 67 is in the bottom chamber of the tank 63. This controller 67 controls (manages) the temperature of the alignment system AL and the optical projection system PL via the cooling agent at a predetermined temperature such as 23° C.±0.01° C. by controlling the driving operation of the heater 71 according to the detection result of the temperature sensors 66 and 69. Here, a broken line to which a reference FL is added in FIG. 4 indicates a surface (a floor surface on which the exposure system 1 is disposed) on which the exposure system 1 which is shown in FIG. 1 is disposed. Therefore, the most of the members which are explained as above so as to form the first controlling system 61 are disposed so as to be at the disposition surface FL or higher; thus, only the heat exchanger 70 is disposed at the disposition surface FL or lower.

The cooling agent which is cooled (over-controlled or over-cooled) in the heat exchanger 70 as the first temperature adjusting device in the second controlling system 62 is divided into a circulating system C5 which circulates in the reticle stage 2 and a circulating system C6 which circulates in the wafer stage 5. The cooling agent in the second controlling system 62 is circulated in a closed system such that the cooling agent should not return to the tank 63. Here, the circulating system C5 corresponds to the first circulation path according to the present invention. The circulating system C6 corresponds to the second circulation path according to the present invention. Both the circulating system C5 and the circulating system C6 correspond to the circulating path for the liquid according to the present invention.

In the circulating system C5, a heater 75 which corresponds to a part of the second temperature adjusting device is disposed in a downstream position of the heat exchanger 70 and temperature sensors 76a and 76b which detect the temperature of the cooling agent under conditions in which the cooling agent is about to be circulated in the reticle stage 2 and the temperature of the cooling agent under conditions in which the circulation of the cooling agent is completed in the reticle stage 2. The result of the detection by the temperature sensors 76a and 76b are outputted to the controller 77. The controller 77 calculates a simple average or a weighted average of the detection result which is outputted from the temperature sensors 76a and 76b. The temperature of the reticle stage 2 is controlled (managed) at a predetermined temperature such as 23° C.±0.01° C. by performing a feedback controlling operation for the heater 75 according to the calculated temperature of the cooling agent.

Also, in the circulating system C6, a heater 78 which corresponds to a part of the second temperature adjusting device is disposed in a downstream position of the heat exchanger 70 and temperature sensor 79a and 79b which detect the temperature of the cooling agent under condition that the cooling agent is about to be circulated in the wafer stage 5 and the temperature of the cooling agent under condition that the circulation for the cooling agent is completed in the wafer stage 5. The result of the detection by the temperature sensors 79a and 79b are outputted to the controller 77. The controller 77 calculates an average or a weighted average of the detection result which is outputted from the temperature sensors 79a, 79b. The temperature of wafer stage 5 is controlled (managed) at a predetermined temperature such as 23° C.±0.01° C. by performing a feedback controlling operation for the heater 78 according to the calculated temperature of the cooling agent. The cooling agent which is circulated in the reticle stage 2 by the circulating system C5 and the cooling agent which is circulated in the wafer stage 5 by the circulating system C6 are collected in a sealed tank 30. After that the cooling agent is compressed to be transmitted to the heat exchanger 70 by a pump 74 as a circulating device. Here, the tank 80 corresponds to a first tank or sealed tanka sealed tank in the present invention.

As explained above, the reticle stage 2, the wafer stage 5, the temperature sensors 76a and 76b, and the temperature sensors 79a and 79b among the members which form the second controlling system 62 are disposed at the position surface FL or higher. Also, the tank 80, the pump 74, the heat exchanger 70, the heaters 75, 78, and the controller 77 are disposed at the disposition surface FL or lower. Therefore, there is a vertical gap between the circulating systems C5 and C6. The cooling agent which is circulated in the reticle stage 2 by the circulating system C5 and the cooling agent which is circulated in the wafer stage 5 by the circulating system C6 receives not only an output from the pump 74 but also an influence by gravity so as to be collected in the tank 80. Therefore, for example, if the circulation of the cooling agent is stopped, there is a possibility that a great negative pressure will be generated in the reticle stage 2 and the wafer stage 5.

When the negative pressure is generated in the reticle stage 2 and the wafer stage 5, a cooling pipe which is disposed so as to accompany a linear motor which is provided with these stages may be deformed. A space through which the cooling liquid is supposed to flow between a heat generating section of the linear motor and the cooling pipe is narrowed; thus, the cooling liquid hardly flows smoothly. Therefore, cooling efficiency is reduced; thus, a performance of the linear motor may be reduced. In order to prevent the negative pressure which came the above disadvantages from occuring, a tank 81 which is open to the atmosphere is disposed in a position which is at the disposition surface FL or higher in the present embodiment. The tank 81 and the tank 80 which is disposed at the disposition surface FL or lower is connected by a connection pipe 82 as a first piping arrangement. The tank 81 corresponds to the tank in the present invention or the second tank which can be disposed at any desirable position which is at the disposition surface FL or higher. It is preferable that the height of the surface of the cooling agent which is contained in the tank 81 be disposed between the reticle stage 2 and the wafer stage 5 by taking the back pressure of the wafer stage 5, the negative pressure of the reticle stage 2, and a capacity of the pump 74 into consideration with regards to a height direction (Z direction). Furthermore, it is preferable that the height of the cooling agent be set in the tank 81 by taking a balance for both an upper limit value and a lower limit value for a pressure resistance of a motor (an object to be cooled) near the reticle stage 2 and a pressure resistance of a motor (an object to be cooled) near the wafer stage 5.

By realizing such a structure, a positive pressure is applied to the wafer stage (a piping arrangement which circulates the linear motor near the wafer stage) when the cooing agent is replenished in the circulation path because the tank 81 which is opened to the atmosphere is disposed between the wafer stage and the reticle stage. In contrast, although a slight amount of negative pressure is applied to the reticle stage (a piping arrangement which is circulated in the linear motor near the reticle stage), such a negative pressure corresponds only to a vertical difference (for example, 0.3 m) between the linear motor near the reticle stage and the tank 81. The negative pressure which is applied to the reticle stage under this condition is far less than the negative pressure which is caused by a vertical gap (for example, 7 m) between the tank 80 and the reticle stage which are disposed at the disposition surface FL or lower. In addition, whether it is a positive pressure or a negative pressure, it is possible to set the pressure which is applied to the reticle stage very low level (at an insignificant level) as a result from a pressure resistance point of view if the pressure-resistance capacity of the piping arrangement in the reticle stage and such a slight negative pressure are taken into account. Therefore, it is almost possible to ignore a deformation (compression damage) in the piping arrangement in the reticle stage which is caused by the negative pressure which is applied to the reticle stage by the vertical gap between the linear motor in the linear motor and the tank 81.

Here, a detection sensor 200 (detecting section) which monitors (detects) a surface of the liquid (surface) of the liquid which is contained in the tank 81 which is open to the atmosphere. Even if the liquid which flows in the circulation path C5 or C6 leaks somewhere, it is possible to detect the leak of the liquid by monitoring a vertical movement of the surface of the liquid by this sensor 200. The output from the sensor 200 is sent to the controller 77. The controller 77 activates a notification device 210 which notifies (alarm) an operator for an information that the surface of the liquid is lowered if the sensor 200 notifies so. Here, in the present embodiment, the output from the sensor 200 is sent to the controller 77. However, the present invention is not limited to such an embodiment; thus, it is acceptable if the output from the sensor 200 may be sent to a main CPU (which is not shown in the drawing) in the exposure system 1 so as to notify an information for such a condition to a monitor which is disposed in the exposure system 1.

Also, as shown in FIG. 4, if the tank 80 which is disposed in the circulating systems C5 and C6 are disposed at the disposition surface FL or lower, it is necessary to eliminate air which remains in the entire circulating systems C5, C6 by a gravity so as to fill the cooling agent therein so as to reduce a load in the pump 74 and reduce the size thereof. However, sometimes, there may be a case in which it is not possible to set a flow amount in the circulating systems C5, C6 due to a limitation such as a pressure resistance capacity in the cooling pipe in the linear motor because it is not possible to eliminate the air which remains in the circulating systems C5, C6 completely and a negative pressure is generated due to remaining air (bubble) if it is not possible to pour the cooling agent from the highest point in the circulating systems C5, C6. For example, in such a case, the tank 81 is disposed lower than the highest point of the circulating system C5 of the reticle stage 2.

In order to prevent such a negative pressure, the piping arrangement 83 which eliminates the bubbles which are contained in the cooling agent is connected to a part (a space between the reticle stage 2 and the tank 80) of the circulating system C5. Simultaneously, the piping arrangement 84 is connected to a part (a space between the wafer stage 5 and the tank 80) of the circulating system C6; thus, the piping arrangements 83 and 84 and the tank 81 are connected. Also, valves 85 and 86 which adjust the flow amount are disposed in the piping arrangements 83 and 84. Here, the piping arrangement 83 corresponds to the first removing piping arrangement in the present invention. The piping arrangement 84 corresponds to the second removing piping arrangement in the present invention. The piping arrangement 83 and the piping arrangement 84 correspond to the second piping arrangement or the removing piping arrangement. Also, the valves 85 and 86 correspond to the flow rate adjusting members in the present invention.

As shown in FIG. 4, the piping arrangements 83 and 84 are connected to the circulating system C5, C6; therefore, there may be phenomena in that if the fluid amount in the circulating systems C5, C6 are different from each other, only the cooling agent which is circulated in either one of the circulating system flows into the tank 81 through the piping arrangement (either one of 83 or 84) and the cooling agent which is circulated in the other circulating system does not flow into the piping arrangement through another piping arrangement (83 or 84). When this phenomena occurs, there is a problem in that, although it is possible to eliminate the bubbles which are contained in the cooling agent which is circulated in one of the circulating system of which cooling agent flows into the tank 81, it is not possible to eliminate the bubbles which are contained in the cooling agent which is circulated in another circulating system. In order to solve such a problem, the valves 85 and 86 are disposed so as to adjust a balance between a fluid amount of the cooling agent which flows into the tank 81 from the circulating system C5 through the piping arrangement 83 and the fluid amount of the cooling agent which flows into the tank 81 from the circulating system C6 through the piping arrangement 84.

By the above structure, the cooling agent which contains the bubbles flows into the tank 81 through the piping arrangements 83 and 84 during the circulation of the cooling agent in the circulating systems C5, C6; thus, the bubbles are emitted into the atmosphere from a surface of the liquid which is contained in the tank 81. In this way, in the present embodiment, the bubbles which are contained in the cooling agent are eliminated gradually while the cooling agent is circulated in the circulating systems C5, C6; therefore it is possible to reduce the back pressure which is caused by the bubbles which are contained in the cooling agent gradually. Finally, it is possible to completely eliminate the back pressure which is caused by the bubbles (ex. the bubbles of the air). Also, the bubbles are removed automatically only by circulating the cooling agent; therefore, it is possible to omit an operation for an operator to eliminate the bubbles which are contained in the cooling agent which is circulated in the circulating systems C5, C6 periodically; thus, it is possible to reduce a cost which is required for maintenance for the exposure system.

Here, although in the present embodiment, the piping arrangements 83 and 84 which remove the bubbles are connected to the circulating systems C5, C6 respectively, the present invention is not limited to this embodiment. It is acceptable that a plurality of piping arrangements which remove the bubbles be connected to the circulating systems C5, C6 respectively (in this case, valves (which are equivalent to the valves 85 and 86) are disposed to each one of a plurality of the piping arrangements). In this way, there is an effect in that it is possible to shorten the time which is required to eliminate the bubbles only by disposing a plurality of piping arrangements which remove the bubbles from a circulating system. Here, it is possible to dispose a plurality of the piping arrangements which remove the bubbles at any desired location.

Figure 5:
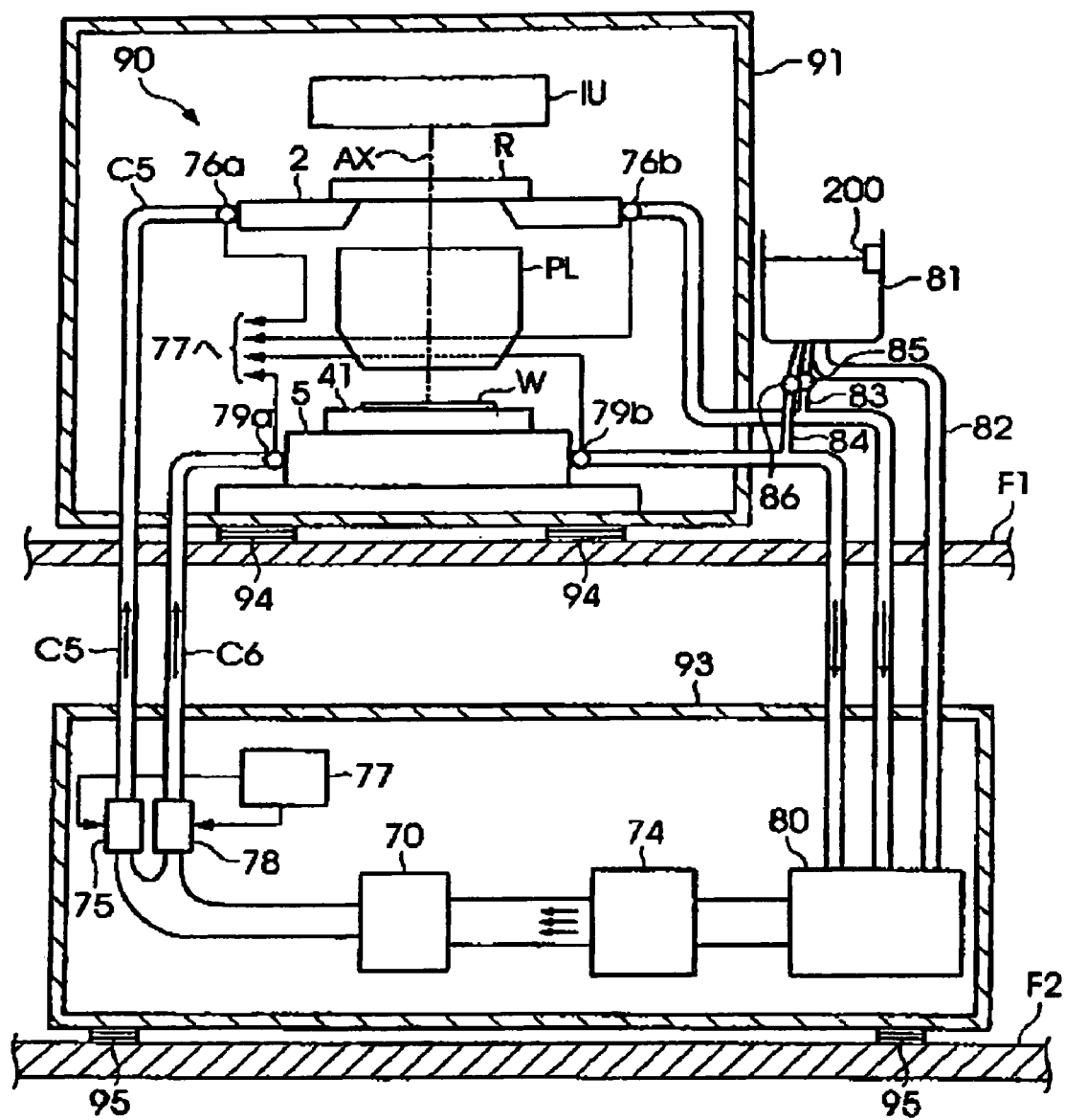
FIG. 5 is a view showing an example for a disposition arrangement of a temperature controlling device which is provided in an exposure apparatus according to an embodiment of the present invention.

Next, an example for disposing the temperature controlling device which is explained above is explained. FIG. 5 is a view for showing an example for a disposition arrangement of a temperature controlling device which is provided in an exposure system according to an embodiment of the present invention. Here, most of the members of the first controlling system which are shown in FIG. 4 are omitted in FIG. 5. Instead, the members which relate to the second controlling system 62 are shown in FIG. 5. In FIG. 5, the same reference numerals are added to members which correspond to the members which are shown in FIG. 4.

As shown in FIG. 5, an exposure main body 90 which contains a lighting optical system IU, a reticle stage 2, an optical projection system PL, and wafer stage 5, etc. is contained in an exposure chamber 91. A tank 80, a pump 74, a heat exchanger 70, heaters 75 and 79, and a controller 77 which an disposed in the temperature controlling device are contained in a temperature adjusting device 93.

The exposure chamber 91 which contains an exposure main body section 90 is disposed on a floor F1 via vibration preventing pads 94. The temperature adjusting device 93 is disposed on a floor F2 which is disposed under the floor F1 via the vibration preventing pads 95. The exposure chamber 91 and the temperature adjusting device 93 are disposed separately. Here, the disposition surface FL in FIG. 4 indicates a height position of the floor F1 which is shown in FIG. 5. A piping arrangement is disposed in a space between the exposure chamber 91 and the temperature adjusting device 93 similarly to a case for the temperature controlling device which is shown in FIG. 4 such that a temperature controlling device is disposed which is formed by the circulating system C5 and the circulating system C6.

Also, as shown in FIG. 5, the tank 81 is disposed in the horizontal vicinity of the exposure chamber 91 so as to be between the reticle stage 2 and the wafer stage 5 vertically.

When a detecting device which detects a leak of the liquid of the cooling agent by making use of a fluctuation of the surface of the cooling agent which is stored in this tank 81 is provided, it is preferable to use a piping arrangement (which correspond to a circulation piping arrangement of the present invention) which is used for the circulating systems C5, C6 and a piping arrangement 82 of which the material member has a deformation (fluctuation of volume) which is caused by the cooling agent should be smaller than a predetermined value in order to restrict as much as possible fluctuation of the surface of the liquid under conditions that the liquid agent is circulated normally without the cooling agent leaking. It is preferable to use a material member such as a stainless steel of which rigidity is high for such a material for the piping arrangement. Also, it is preferable to use a stainless steel flexible piping member for a part which must be bent. Also, in the present embodiment, the deformation of the material member which is used for the circulating systems C5 and C6 and the connecting piping arrangement 82 which is caused by the pressure is smaller than (different from) a deformation of the material member (resin) which is used for the piping arrangements 83 and 84. However, the present invention is not limited to such an embodiment; thus, it is acceptable to form entire piping arrangements (a circulating piping arrangement and circulating arrangements 82 to 84) by a single material member.

Figure 6A:
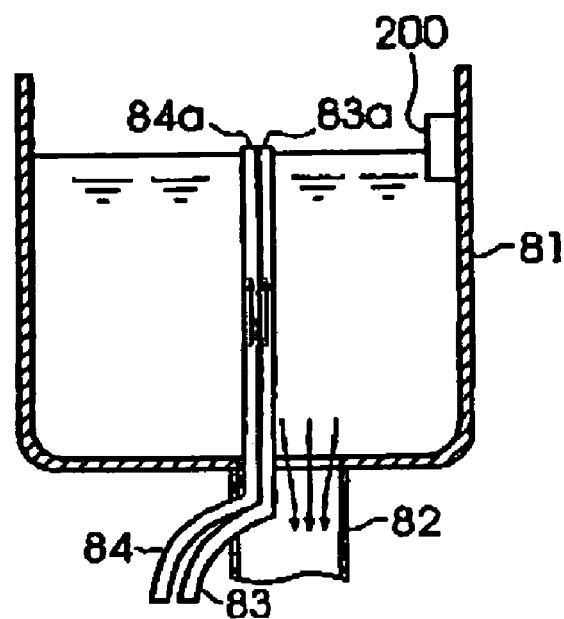
FIGS. 6A and 6B are views for examples for a connection between the tank 81 and a connection pipe 82 and a connection between the tank 81 and the connection pipes 83 and 84.
Figure 6B:
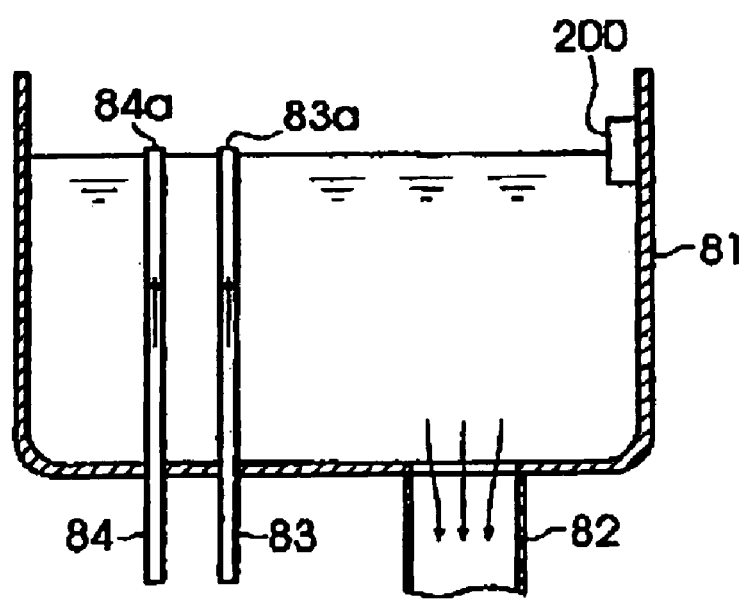

Here, an example for a connection between the tank 81, connecting piping arrangement 82, and the connecting piping arrangements 83 and 84. FIGS. 6A and 6B are views for examples for a connection between the tank 81 and a connection pipe 82 and a connection between the tank 81 and the connection pipes 83 and 84. FIG. 6A shows an example of a connection in which the tank 81 is small. FIG. 6B shows an example of a connection in which the tank 81 is large. As shown in FIG. 6A, if the tank 81 is a small tank, the piping arrangements 83 and 84 are not connected to the tank 81 directly. Instead, the piping arrangements 83 and 84 are disposed inside of the connecting piping arrangement 82 through a side wall of the connecting piping arrangement 82 in the vicinity of a bottom section of the tank 81 so as to be disposed in the tank 81 via a connecting section which connects the tank 81 and the connecting piping arrangement 82. Thus, the piping arrangements 83 and 84 are connected with the tank 81 indirectly.

Both an end section 83a of the piping arrangement 83 and an end section 84a of the piping arrangement 84 are disposed so as to be higher than a surface of the cooling agent which is stored in the tank 81. In this way, both the end section 83a of the piping arrangement 83 and the end section 84a of the piping arrangement 84 are disposed so as to be higher than a surface of the cooling agent which is stored in the tank 81. By doing this, the bubbles which are contained in the cooling agent which flows into the tank 81 through the piping arrangements 83 and 84 are emitted into the atmosphere without receiving a pressure (fluidic pressure) from the cooling agent which is stored in the tank 81; therefore, it is possible to eliminate the bubbles from the cooling agent very efficiently.

Also, as shown in FIG. 6B, if the tank 81 is a large tank, it is possible to connect the piping arrangements 83 and 84 and the tank 81 by disposing the piping arrangements 83 and 84 through the bottom surface of the tank 81 directly. Similarly, in such a case, it is preferable to dispose the end sections 83a and 83b of the piping arrangements 83 and 84 so as to be higher than a surface of the cooling agent which is stored in the tank 81. Here, in FIG. 5, the piping arrangement which forms a part of the circulating systems C5 and C6 is drawn so as to be in parallel with the floor F1 from the exposure chamber 91 by taking the floating force of the bubbles into account such that the piping arrangements 83 and 84 are connected in an approximate orthogonal direction (Z direction) to the drawn piping arrangements 83 and 84. However, the condition for connecting the piping arrangement which forms a part of the circulating systems C5 and C6 and the piping arrangements 83 and 84 which removes the bubbles is not limited to the example shown in FIG. 5. For example, it is possible to eliminate the bubbles by making use of the bubbles floating force effectively as long as there is an upward inclination in the piping arrangements; thus, it is possible to employ any desirable connecting condition.

Figure 7:
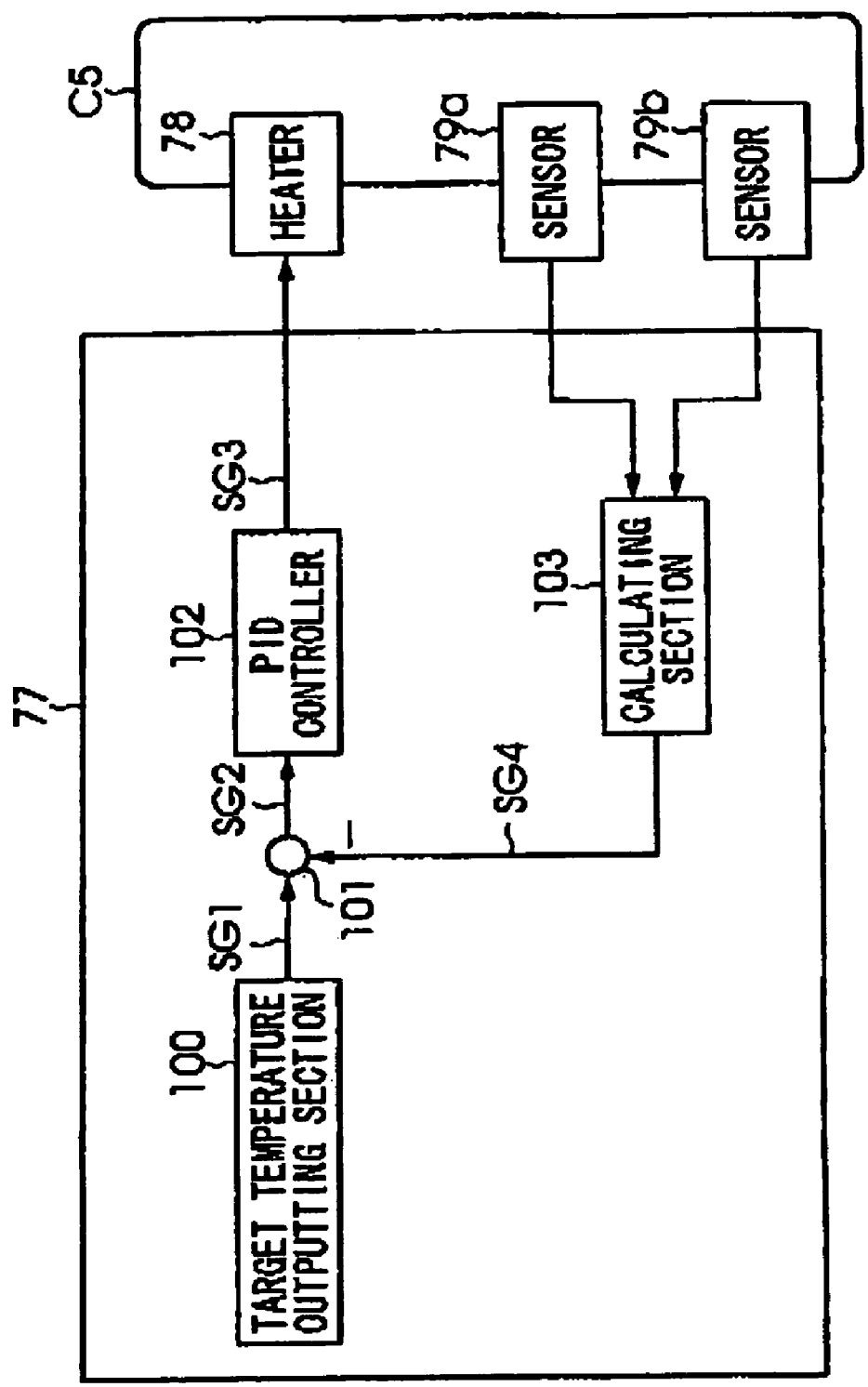
FIG. 7 is a block diagram showing a structure of a section which controls the temperature of the wafer stage 5 in a controller 77 in particular.

As explained above, the explanations were made mainly for a connecting condition in the temperature controlling device which is provided in the exposure system according to an embodiment of the present invention. Next, structures of the controllers 67 are explained briefly. FIG. 7 is a block diagram for showing a structure of a section which controls the temperature of the wafer stage 5 in a controller 77 in particular. Here, a section which controls the temperature of the reticle stage has a similar structure; therefore, its structure is omitted in FIG. 7. Also, the structure of the controller 67 is similar to the structure of the controller 77 shown in FIG. 7.

That is, in FIG. 7, it is possible to explain the structure of the member in the controller 77 which controls the temperature of the reticle stage 2 by understanding that the heater 78, the temperature sensor 79a, and the temperature sensor 79b shown in FIG. 7 should be compatible with the heater 75, the temperature sensor 76a, and the temperature sensor 76b. Also, it is possible to explain the structure of the controller 67 by understanding that the controller 77, the heater 78, the temperature sensor 79a, and the temperature sensor 79b should be compatible with the heater 71, the temperature sensor 66, and the temperature sensor 69 respectively. Here, only the member in the controller 77 which controls the temperature of the wafer stage 5 is explained so as to prevent duplicated explanation below. In FIG. 7, the wafer stage 5 is omitted.

As shown in FIG. 7, the member in the controller 77 which controls the temperature of the wafer stage 5 contains a target temperature outputting section 100, a calculating section 101, a PID (Proportional Integral Derivative) controller 102, and a calculating section 103. The target temperature outputting section 100 outputs a target temperature signal which indicates a target temperature (for example, 23° C.) for the wafer stage 5. The calculating section 51 outputs a deviation signal SG2 which corresponds to a difference between the target temperature signal SG1 which is outputted from the target temperature outputting section 100 and a returning signal SG4 which is outputted from the calculating section 103.

The PID controller 102 outputs a control signal SG3 which controls a heating amount of the heater 78 according to the inputted deviation signal SG2. The calculating section 103 performs a predetermined calculating processing operations (for example, an average processing operation) for a result of the detection by the temperature sensors 79a and 79b so as to output the calculated result as the returning signal SG4. In this way, the controller 77 controls the temperature of the wafer stage 5 by a feedback controlling operation.

Here, the structure of the exposure system according to an embodiment of the present invention has been explained as above. Next, an operation is explained under condition that a light is exposed in the exposure system. When an operation for exposing a light begins, a stage controller which is not shown in the drawing accelerates the reticle stage 2 and the wafer stage 5. When velocities for the reticle stage 2 and the wafer stage 5 reache predetermined velocities, a main controlling system which is not shown in the drawing emits a lighting light from the lighting optical system JU so as to light a predetermined rectangular lighting area on the reticle R with a uniform illumination.

The wafer W is scanned against an exposed area which serves for the lighting area optically compatibly with regards to the optical projection systems PL so as to be synchronous with a scanning operation of the reticle R in the Y direction with regards to the lighting area. By doing this, the lighting light which passes through a pattern area of the reticle R is reduced in 1/α of magnification by the optical projection system PL; thus, a reduced image of the pattern is projected on the wafer W on which a resist is applied. Consequently, a pattern of the reticle R is transcribed on an exposed area on the wafer W successively such that an entire surface of the pattern area on the reticle R is transcribed on a shot area on the wafer W in a single scanning operation.

When the reticle rough motion stage 16 moves, for example, in +Y direction, momentum is conserved by moving the fixed element 20 in the −Y direction; thus, it is possible to set off the reaction force which is accompanied by the movement of the reticle rough motion stage 16 and prevent the fluctuation of the barycentric position. Also, it is possible to move the fixed element 20 at a predetermined position so as to resist a coupling section which is formed by the movable element 21 and the fixed element 20 by moving the trim motor 72 under such a condition.

During such a series of the exposing processing operations, a heat is generated in the optical projection system PL by the lighting light (thermal absorption in the optical projection system PL), and heat is generated in the alignment system AL by the alignment light (thermal absorption in the alignment system AL). Simultaneously, heat is generated in each motor while driving the reticle stage 2 and the wafer stage 5. In the first controlling system 61, the controller 67 performs a feedback controlling operation according to a detection result by the temperature sensors 66 and 69 so as to control the driving operation for the heater 71. By doing this, the temperature in the optical projection system PL and the alignment system AL are controlled within ±0.01° C. Also, in the second controlling system 62, the controller 77 performs a feedback controlling operation according to the detection result by the temperature sensors 76a, 76b, 79a, and 79b so as to control the driving operation for the heater 75 and 78. By doing this, the temperature in the reticle stage 2 and the wafer stage 5 are controlled within ±0.1° C.

In the reticle stage 2, the controller 77 performs a calculation for obtaining a simple average of the temperature of the cooling agent which is detected by the temperature sensors 76a and 76b so as to adjust and manage the driving operation for the heater 75 according to the calculated temperature of the cooling agent. Similarly, in the wafer stage 5, the controller 77 performs a calculation for obtaining a simple average of the temperature of the cooling agent which is detected by the temperature sensors 79a and 79b so as to adjust and manage the driving operation for the heater 78 according to the calculated temperature of the cooling agent.

Explanations have been made for an operation of the exposure system according to the present invention as above. The exposure system according to the present embodiment is manufactured by assembling various subsidiary systems which contain various members such that a predetermined mechanical accuracy, an electrical accuracy, and an optical accuracy are maintained. In order to maintain such accuracies, an adjustment is performed for achieving the optical accuracy for each of the optical systems, an adjustment is performed for achieving the mechanical accuracy for each of the mechanical systems, and an adjustment is performed for achieving the electrical accuracy for each of the electrical systems before the assembling operation and after the assembling operation.

The assembling steps from various subsidiary systems to the exposure system contain a mechanical connection between various subsidiary systems, an electrical connection of the electric circuits, and a piping arrangement connection for air pressure circuit, etc. It is needless to say that there is an assembling step for assembling each of various subsidiary systems before assembling these various subsidiary systems to the exposure system. After the assembling step from the various subsidiary system to the exposure system is completed, a total adjustment is performed so as to obtain various accuracies for the overall exposure system. Here, it is preferable that the exposure system be manufactured in a clean room in which the temperature and cleanness are under control.

Figure 8:
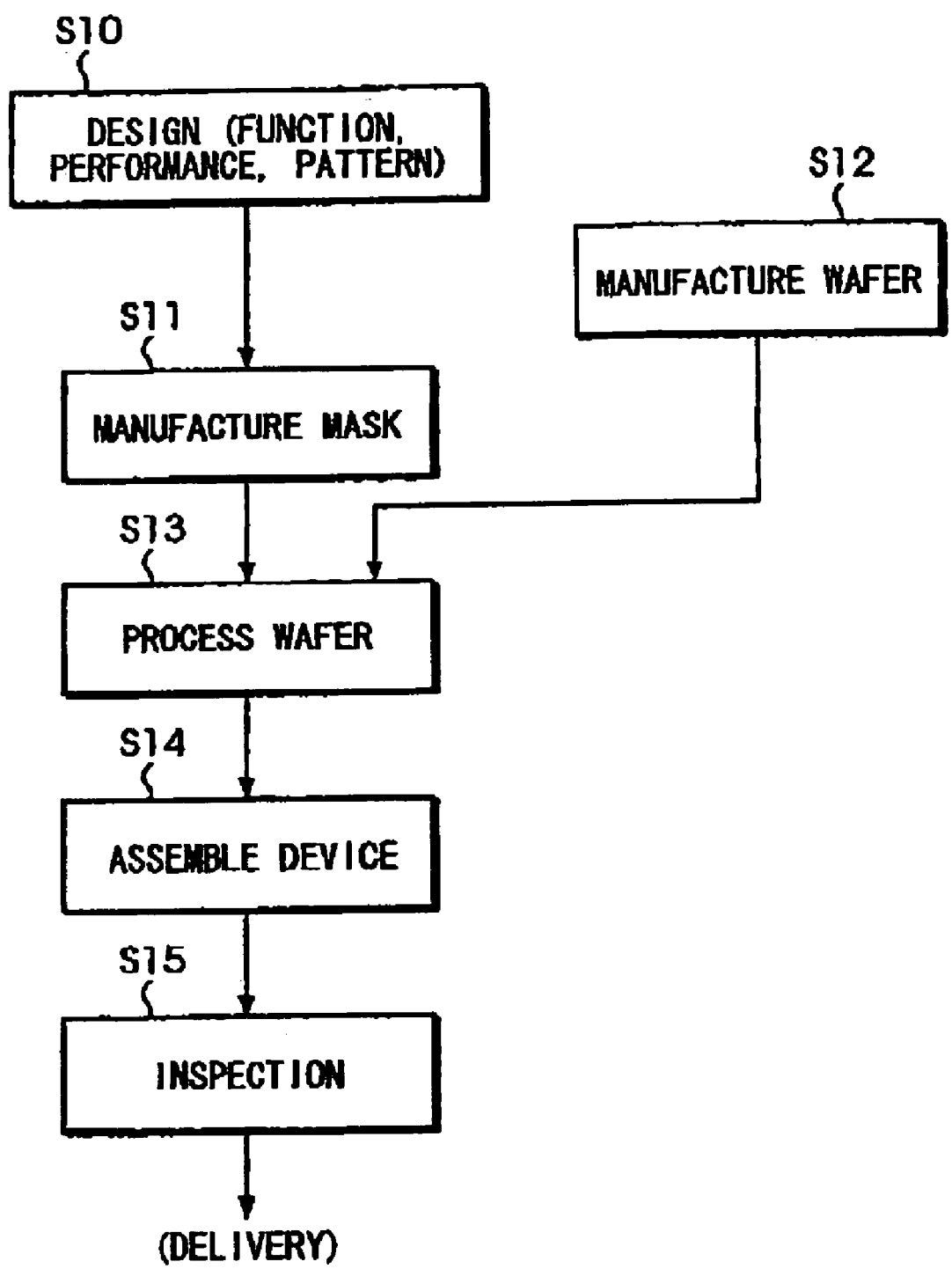
FIG. 8 is a flow chart showing an example of a step for manufacturing a device by using the exposure system according to the embodiment of the present invention.

Next, explanations are made for a manufacturing operation for a device in which the above-explained exposure system is used. FIG. 8 is a flow chart which shows an example of a step for manufacturing a device (a semiconductor chip such as an IC and an LSL, a liquid crystal panel, a CCD, a thin film magnetic head, and a micro-machine, etc.) by using the exposure system according to the embodiments of the present invention. As shown in FIG. 8, at first, functions of the device (for example, design for a circuit of the semiconductor device) is designed in step S10 (design step), also, a pattern is designed for realizing the function. Consequently, a mask in which the designed circuit pattern is formed is manufactured in step S11 (step for manufacturing a mask). On the other hand, a wafer is manufactured by using a material member such as a silicon, etc. in a step S12 (step for manufacturing a wafer).

Next, in step S13 (wafer processing step) an actual circuit, etc, is formed on a wafer by a lithographic technology by using the mask and the wafer which are prepared in step S10 to step S12. Consequently, the wafer which is processed in step S13 is made into a chip in step S14 (assembling step). This step S14 contains various steps such as an assembling step (dicing, bonding) and a packaging step (sealing a chip), etc. Finally, various inspections such as an operation test for a device which is manufactured in step S14 and a durability test, etc. are performed in step S15 (inspection step). A device is manufactured after these steps; thus, this completed device is delivered.

As explained above, according to the exposure system according to an embodiment of the present invention, even if many members which form the temperature controlling device, in particular, such as the pump 74 and the tank 80 must be disposed under the disposition surface FL (floor F1) of the exposure system 1 inevitably due to a limitation, for example, such as a disposition area for the exposure system in the clean room as shown in FIG. 5, it is possible to prevent the negative pressure from being generated in the circulation path (circulating systems C5 and C6) of the cooling agent because the tank 81 which is open to the atmosphere which is disposed at the disposition surface FL (floor F2) or higher and the tank 80 are connected by the connecting piping arrangement 82.

Also, the piping arrangements 83 and 84 are connected so as to eliminate the bubbles which are contained in the liquid agent which is circulated in the circulating systems C5 and C6 in each of the circulating systems C5, C6; therefore, the bubbles which are contained in the cooling agent are eliminated automatically during the circulation of the cooling agent in the circulating systems C5 and C6. Therefore, it is possible to reduce the back pressure which is caused by the bubbles which are contained in the cooling agent gradually; thus, it is possible to finally eliminate the back pressure completely.

Furthermore, in the present embodiment, the tank 81 which is open to the atmosphere is disposed, and a sensor 200 which detects a fluctuation (vertical movement of the surface of the liquid) of the liquid in the tank 81 is disposed in the tank 81. Therefore, it is possible to improve reliability for detecting a leak of the liquid (a fluctuation of an amount of the liquid) which is circulated in the circulating system. If a case is assumed in which the fluctuation of the surface of the liquid is not detected in the tank 81 but a detection is made under conditions that some part of the piping arrangement is open to the atmosphere, a pressure is applied to the piping arrangement according to an ON/OFF operation (driving/stopping) of the pump 74. Therefore, a deformation such as an inflation and a contraction may occur in the piping arrangement due to the pressure; thus, a volume in the piping arrangement fluctuates (such a fluctuation occurs noticeably in a piping arrangement if a piping arrangement is made of a resin. Also, such a fluctuation also may occur in a piping arrangement which is made of a stainless steel).

A diameter (cross sectional area) of the piping arrangement is not so great that a surface of the liquid in the piping arrangement moves vertically due to an influence of this fluctuation of the volume. Therefore, if a sensor for a surface of a liquid such as a sensor 200 is disposed in the piping arrangement, the fluctuation of a surface of the liquid which is generated when the ON/OFF operation of the pump is performed is detected sensitively; thus, there is a problem in that it is difficult to determine whether the fluctuation of the surface of the liquid is generated by a leak of the liquid, or the fluctuation of the surface of the liquid is generated by the fluctuation of the volume in the piping arrangement. In contrast, in the embodiments of the present invention, the sensor 200 is disposed in the tank 81 (therefore, the surface of the liquid in the tank 81 hardly fluctuates by the fluctuation of the volume in the piping arrangement) which has a cross sectional area which is far greater than a cross sectional area in the piping arrangement. Therefore, the surface of the liquid in the pump 81 does not fluctuate due to the ON/OFF operation for the pump 74. Otherwise, only very slight fluctuation occurs on the surface of the liquid in the pump 81 (almost insignificant). Thus, it is possible to detect only the fluctuation of the surface of the liquid due to the leak of the liquid reliably; thus, it is possible to improve the reliability of the detection of the leak of the liquid as a result.

Therefore, in the present embodiment, it is possible to prevent occurrence of negative pressure and increase in back pressure in the circulating path for the cooing agent; thus, a cooling capacity of the temperature controlling device for cooling a source for generating heat such as a motor, etc., which is disposed in the reticle stage 4 and the wafer stage 5 can be maintained. Therefore, it is possible to maintain a desirable performance of the exposure 5 in a stable condition. As the result, it is possible to manufacture a fine device accurately at a high through-put; thus, it is possible to improve an efficiency for manufacturing the device.

Although explanations have been made for the embodiments of the present invention as above, the present invention is not limited to the above-explained embodiments; thus, various modifications can be made within a scope of the present invention. For example, an example is explained in which the temperature is controlled for a temperature controlling object such as the reticle stage 2, the wafer stage 5, and the optical projection system PL by controlling the temperature of the fluid amount of the cooling agent in the above-explained embodiments. However, the present invention is not limited to such embodiments; thus, it is acceptable if the temperature of the temperature controlling object is controlled by controlling the flowing speed and the fluid amount (fluid flowing rate) of the cooling agent.

Also, in the above-explained embodiment, the first controlling system 61 which is disposed at the disposition surface FL on which the exposure system 1 is disposed or higher performs a temperature controlling operation for the optical projection system PL as shown in FIG. 4. However, it is acceptable if the temperature of the optical projection system PL is controlled by circulating the cooling agent by the temperature controlling system which is disposed at the disposition surface FL or lower. Also, in the present embodiment, the tank 81 which is disposed at the disposition surface FL or higher and the tank 80 which is disposed at the disposition surface FL or lower in an upper stream of the pump 74 are connected through the connecting piping arrangement 82. However, a member to which the tank 81 is connected through the connecting piping arrangement 82 is not limited to such a condition. Any desirable position is acceptable as long as the member to which the tank 81 is connected through the connecting piping arrangement 82 is disposed in a path between the reticle stage 2 or the wafer stage 5 and the pump 74.

Also, the same cooling agent (HFE) is used for the cooling agent which is circulated in the first controlling system 61 and the second controlling system 62 in the above-explained embodiment. However, different cooling agents may be used for each circulating system according to the temperature controlling accuracy and a disposition condition which are required for each circulating system. Also, in FIG. 5, an example is explained in which the tank 81 is drawn. However, it is acceptable if a chamber which contains the tank 81 is disposed. In order to realize such a structure, it is preferable that a member (for example, the tank 63, the evaporator 65, and the refrigerator 73) which is disposed in the first controlling system 61 which is shown in FIG. 4 be disposed in the chamber so as to omit the disposition area.

Also, the heaters 75 and 78 are disposed at the disposition surface FL or lower in the above embodiment; therefore, a certain length of time is necessary until the cooling agent of which the temperature is set at a certain temperature by these heaters 75 and 78 reaches the reticle stage 2 and the wafer stage 5. Therefore, such a condition is not preferable for controlling the temperature in the exposure chamber 91 highly accurately because there is an idle time for a controlling operation. Therefore, it is preferable to perform not only a feedback controlling operation by the controller 77 according to the detection result by the temperature sensors 76a, 76b, 79a and 79b but also a feedforward controlling operation according to driving frequency (times) and a moving distance, etc., of the reticle stage 2 and the wafer stage 5.

Furthermore, an example is explained in which the heaters 75 and 78 and the controller 77 are disposed at the disposition surface FL or lower in the above-explained embodiments. However, if there is an allowance for the disposition area at the disposition area FL or higher (position above the floor F1), it is preferable to dispose these members at the position which is at the disposition surface FL of higher. By realizing such a structure, it is possible to dispose the heaters 75 and 78 near an object of which temperature is supposed to be controlled such as the reticle stage 2 and the wafer stage 5; thus, it is possible to shorten the idle time for the controlling operation. Also, by disposing the controller 77 near the temperature sensors 76a and 76b, it is possible to anticipate that a ratio (S/N ratio) of a level between the detection result by the temperature sensors 76a, 76b, 79a and 79b and a noise may be increase. Such a condition is preferable for performing a temperature controlling operation highly accurately.

Here, it is preferable that the idle time for the controlling operation be as short as possible; therefore, it is preferable that the heaters 75 and 78 be as close as possible to the object of which temperature is supposed to be controlled. However, various members are disposed inside of the exposure chamber 91 in addition to the members which are shown in FIG. 5; therefore it is not necessarily possible to dispose the members such as heaters 75 and 78, etc. at any desirable position. Therefore, it is preferable that the heaters 75 and 78 be disposed as close as possible to the temperature controlling device to an extent such that it is possible to realize a certain level of response for maintaining the fluctuation of the temperature in the exposure chamber 91 within an allowable range which is required so as to maintain the performance of the exposure system and an S/N ratio in the temperature sensors 76a, 76b, 79a and 79b.

Also, it is acceptable that each block which forms the controller 77 which is shown in FIG. 7 be formed by an electrical circuit as a hardware or a software. If each block is formed as a software, the function for each block is realized by performing a program which specifies the function of each block by a CPU (Central Processing Unit). Also, in the above-explained embodiment, a part of the temperature adjusting device (a heat exchanger 70) and the pump for driving the cooling agent are used commonly. However, various structures can be adopted; thus, it is acceptable that the pumps be disposed separately for each object which is supposed to be controlled (circulating system) or that the pump be used for all of the circulating systems.

Also, in the above-explained embodiments, a simple average of the temperature of the cooling agent between a condition under which it is before the cooling agent is circulated in the reticle stage 2 and the wafer stage 5 and the condition under which it is after the cooling agent is circulated in the reticle stage 2 and the wafer stage 5. However, it is acceptable if weighted average is calculated. Following methods can be adapted for calculating the weighted average. (1) If the distance between a heat source such as a motor, etc., and the disposition position of a temperature sensor near an entry and the distance between a heat source and the disposition position of the temperature sensor near an exit are different from each other, the weighting operation is performed such that the detection result by the temperature sensor which is disposed nearer should be more weighted. (2) If a material member which forms a vicinity of the entrance to a heat source such as a motor, etc., is different from a material member which forms a vicinity of an outlet thereof, a weighting operation is performed according to a property of the material member such as a thermal conductivity, etc. (the weighting operation is performed such that the material member which has a greater ratio of which heat is absorbed (thermal conductivity is greater) should be more weighted. (3) If the neat source exists near the inlet or the outlet, a weighting operation is performed according to a factor such as whether or not there is another heat source or according to the generated heat amount. For example, if there is another heat source on a flow path, the output from the temperature sensor which is disposed nearer to the another heat source should be more weighted. Also, if there is other heat source outside the path, the heat which is generated in the another heat source is transmitted to the temperature sensor via the air; therefore, the output from the temperature sensor which is disposed nearer to the other heat source is more weighted. (4) Several sets of the temperature which is detected by the temperature sensor near the inlet, the temperature which is detected by the temperature sensor near the outlet, the temperature for controlling the cooling agent, and a measured baseline amount (or an amount of fluctuation of baseline) are stored when the baseline is measured; thus, such a storing operation is repeated every time the baseline is measured. Consequently, an inferred calculation for reducing the fluctuation of the baseline is performed so as to determine the extent of the weighting operation under conditions that either one of the temperature near the inlet and the temperature near the outlet is weighted according to a plurality of sets of the accumulated data. Consequently, the weighted average is calculated according to the inferred weight.

Also, in the above embodiments, the temperature of the wafer stage 5 and the temperature of the reticle stage 2 are controlled by a common controller 77 (the temperature of the heater 75 and the temperature of the heater 78 are controlled by a common controller 77. However, the present invention is not limited to the above embodiments; thus, it is acceptable if the temperature of the wafer stage system (heater 78) and the temperature of the reticle stage system (heater 75) are controlled by independent controllers, each of which is used exclusively for each of the systems.

Here, not only the wafer W which is formed by a semiconductor element but also a glass substrate for a liquid crystal display device, a ceramic wafer for a thin film magnetic head, and a manuscript (synthetic silica, silicon wafer) of a mask or a reticle which is used in an exposure system, etc. are adopted for a substrate in the present embodiment. The exposure system 1 can be adapted to a scanning exposure apparatus (scanning stepper; U.S. Pat. No. 5,473,410) according to a step and scan method in which a pattern of the reticle R is scanned and exposed by moving the reticle R and the wafer W synchronously but also a projection exposure apparatus (stepper) according to a step and repeat method in which a pattern of the reticle R is exposed under conditions that the reticle R and the wafer W are disposed in a static manner. The types of the exposure apparatus 1 is not limited to an exposure apparatus for manufacturing a semiconductor device in which a pattern for a semiconductor device is exposed on the wafer W; thus, the exposure apparatus 1 can be adopted to a wide range of devices such as an exposure apparatus for manufacturing a liquid crystal display element and an exposure apparatus for manufacturing a thin film magnetic head, an image-capturing element (CCD), or a reticle, etc.

Also, it is possible to use a super high pressure mercury lamp which emits a bright line such as a g-line (wavelength 436 nm), i-line (wavelength 365 mn), a high frequency generating device for KrF excimer laser (wavength 248 mn), ArF excimer laser (wavelength 193 nm), $F_2$ excimer laser (wavelength 157 nm), $Kr_2$ laser (wavelength 146 nm), and YAG laser, or a high frequency generating device of the semiconductor laser can be used as a light source for a lighting light for exposure. Also, it is possible to use a charged particle beam such as X-ray or an electron line. For example, a thermal electron emitting Lanthanum Hexaboride (Lab 6) or Tantalum (Ta) can be used for a electron gun when an electron beam is used. Furthermore, when the electron beam is used, it is acceptable that the reticle R be used. Alternatively, it is acceptable that the reticle R not used but that a pattern be formed on the wafer directly.

It is possible to use any magnification for the optical projection system PL such as not only a reduction system, but also an isometric system or a magnifying system. Also, it is desirable to use a material member such as a silica or a fluorite which transmits a deep ultra-violet ray under conditionx that a deep ultra-violet ray such as an excimer laser, etc., is used. If an $F_2$ laser or X-ray is used, it is desirable to use a reflective refractive system or a refractive optical system (a reflective type is used for the reticle R). Also, it is desirable to use an electronic optical system which is formed by an electronic lens and a deflector for an optical system if an electron beam is used. Here, it is needless to say that the inside of the optical path through which the electron beam passes must be under a vacuum condition. Also, it is possible to adopt the present invention in a proximity exposure apparatus in which an optical projection system PL is not used but a pattern of the reticle R is exposed by contacting the reticle R and the wafer W closely.

If a linear motor is used for the wafer stage 5 and the reticle stage 2 (U.S. Pat. No. 5,623,853 or U.S. Pat. No. 5,528,118), it is acceptable to use any one of air-floating type which uses air bearings or a magnetic floating type which uses a Lorenz force or a reactance force. Also, it is possible to use any type of stages 2, and 5 such as a movable type which moves along a guide or a guideless type in which a guide is not provided.

A plane motor which drives the reticle stage 2 and the wafer stage 5 by an electromagnetic force which is generated by facing a magnetic unit (permanent magnet) in which magnets are disposed in a two-dimensional manner and an armature unit in which coils are disposed in a two dimensional manner for a driving structure for the reticle stage 2 and the wafer stage 5. In such a case, it is desirable that either one of the magnetic unit and the armature unit be connected to the reticle stage 2 and the wafer stage 5, and the other one of the magnetic unit or the armature unit be disposed in a vicinity of a movable surface (base) of the reticle stage 2 and the wafer stage 5.

INDUSTRIAL APPLICABILITY

As explained above, according to the present invention, there is an effect that it is possible to prevent the generation of the negative pressure in the circulation path of the liquid member even in a case in which at least a part of the temperature adjusting device is disposed under the installation surface on which the exposure device is disposed because the tank which is disposed higher than the installation surface on which the exposure device is disposed is connected to a middle of a path which is directed from the object to the circulation device via the first piping arrangement; thus, a pressure of the liquid member is applied to a vicinity of an upstream of the circulating device according to a height position of the tank.

Also, according to the present invention, an airtight first tank is disposed in the path which is directed from the object to the circulating device under the installation surface on which the exposure device is disposed, and a second tank is disposed higher than the installation surface on which the exposure device is disposed such that the second tank and the first tank are connected via a first piping arrangement. In the case of such a structure, a great amount of negative pressure is generated because there is a great amount of vertical difference between the object and the first tank. The second tank which is disposed higher than the installation surface and the first tank which is disposed under the installation surface are connected via the first piping arrangement. Therefore, a great amount of pressure which corresponds to the vertical difference between the second tank and the first tank is applied to the first tank (in the vicinity of an upstream of the circulating device); thus, there is an effect in which it is possible to prevent the generation of the negative pressure in the circulation path of the liquid member similarly to a case of the above-explained invention.

Also, according to the present invention, a removing piping arrangement for eliminating the bubbles which are contained in the liquid member is connected to the circulation path; thus, the bubbles which are contained in the liquid member are eliminated automatically by flowing the liquid member which contains the bubbles and is circulated in the circulation path. Such a movement is maintained during circulating of the liquid member in the circulation path; therefore, there is an effect in that it is possible to reduce the back pressure which is caused by the bubbles which are contained in the liquid member as time (number) for circulating the liquid member goes by. Finally, it is possible to completely eliminate the back pressure which is caused by the air.

According to the present invention, a tank which is open to the atmosphere is disposed. By doing this, there is an effect in that it is possible to reduce the fluctuation of the surface of the liquid member even if there is a fluctuation of volume which is caused by a pressure in the piping arrangement. As a result, it is possible to monitor the fluctuation of the surface of the liquid member; thus, it is possible to improve the reliability.

In the above exposure system, there is an effect in that it is possible to prevent the back pressure from being generated and from increasing in the circulation path of the liquid member; thus, a cooling capacity is maintained so as to stabilize a performance of the exposing device at a predetermined performance level. As a result, it is possible to improve an efficiency for manufacturing the devices.

What is claimed is:

1. An exposure system which is provided with an exposure apparatus which projects and transfers an image of a pattern formed on a reticle held on a reticle stage onto a substrate held on a substrate stage through an optical projection system, the system comprising:
   a circulating device which is disposed under an installation surface of the exposure apparatus and circulates a liquid to at least an object among the reticle stage, the substrate stage, and the optical projection system through a circulation pipe so as to control a temperature of the object; and
   a tank which contains the liquid therein, and is disposed higher than the installation surface of the exposure apparatus, and is connected via a first piping arrangement to a portion of a circulation path of the liquid at which the liquid is directed from the object to the circulating device in the circulation path of the liquid.

2. An exposure system according to claim 1, wherein the tank is open to the atmosphere, and
   a height of a surface of the liquid in the tank with respect to the installation surface is set between a height position of the reticle stage and a height position of the substrate stage.

3. An exposure system according to claim 1, further comprising:
   a second piping arrangement which is connected to the circulation path of the liquid and removes bubbles contained in the liquid which is circulated in the circulation path.

4. An exposure system according to claim 3, wherein the second piping arrangement is connected to the tank.

5. An exposure system according to claim 4, wherein an end section of the second piping arrangement is disposed higher than a surface of the liquid in the tank.

6. An exposure system according to claim 3, wherein
   the second piping arrangement is formed by a material which is different from a material which forms the circulation path and the first piping arrangement.

7. An exposure system according to claim 1, further comprising:
   a sealed tank which is disposed under the installation surface and at a portion of the circulation path at which the liquid is directed from the object to the circulating device.

8. An exposure system according to claim 7, wherein the tank is connected to the sealed tank through the first piping arrangement.

9. An exposure system according to claim 1, wherein:
   the circulation path and the first piping arrangement are formed by a material of which fluctuation of volume with respect to pressure is smaller than a predetermined value.

10. An exposure system according to claim 1, further comprising:
    a first temperature adjusting device which is disposed under the installation surface and over-cools the liquid to a temperature lower than a predetermined temperature or over-heats the liquid to a temperature higher than a predetermined temperature; and
    a second temperature adjusting device which is disposed under the installation surface and on a path through which the liquid is directed to the object nearer the object than the first temperature adjusting device and which adjusts the temperature of the liquid, of which temperature is adjusted by the first temperature adjusting device, to the predetermined temperature.

11. A method for manufacturing a device comprising the step of:
    transferring a pattern which is formed on the reticle onto the substrate by using the exposure system according to claim 1.

12. An exposure system which is provided with an exposure apparatus which projects and transfers an image of a pattern formed on a reticle held on a reticle stage onto a substrate which is held on a substrate stage through an optical projection system, the system comprising:
    a circulating device which is disposed under an installation surface of the exposure apparatus and circulates a liquid to at least one object among the reticle stage, the substrate stage, and the optical projection system through a circulation path so as to control a temperature of the object;
    a first sealed tank which contains the liquid therein, and is disposed under the installation surface of the exposure apparatus, and is disposed in a path through which the liquid is directed from the object to the circulating device in the circulation path of the liquid through a first piping arrangement; and a second tank which contains the liquid thereinside and is disposed higher than the installation surface of the exposure apparatus and is connected to the first sealed tank via the first piping arrangement.

13. An exposure system according to claim 12, further comprising:

a second piping arrangement which is connected to an inside of the path through which the liquid is directed from the object to the first tank in the circulation path so as to remove bubbles which are contained in the liquid which is circulated in the circulation path.

14. An exposure system according to claim 13, wherein the circulating device circulates the liquid through a first circulation path which contains the reticle stage and a second circulation path which contains the substrate stage, and the second piping arrangement contains a first removing piping arrangement which is connected to the first circulation path so as to remove the bubbles which are contained in the liquid which is circulated in the first circulation path, and a second removing piping arrangement which is connected to the second circulation path so as to remove the bubbles which are contained in the liquid which is circulated in the second circulation path.

15. An exposure system according to claim 14, wherein flow rate adjusting members are disposed in the first removing piping arrangement and the second removing piping arrangement respectively, which adjust flow rate of the liquid which flows in the first removing piping arrangement and the second removing piping arrangement according to a flow rate of the liquid which is circulated in the first circulation path and the second circulation path respectively.

16. A method for manufacturing a device comprising the step of:

transferring a pattern which is formed on the reticle onto the substrate by using the exposure system according to claim 12.

17. An exposure system which is provided with an exposure apparatus which projects and transfers an image of a pattern of a reticle held on a reticle stage onto a substrate which is held on a substrate stage through an optical projection system, the exposure system comprising:

a circulating device which is disposed under an installation surface of the exposure apparatus and circulates a liquid to at least one object among the reticle stage, the substrate stage, and the optical projection system through a circulation path so as to control a temperature of the object;

a removing pipe which is connected to a portion of the circulation path which the liquid is directed from the object to the circulating device so as to remove bubbles which are contained in the liquid which is circulated in the circulating; and a tank which contains the liquid thereinside, and is disposed higher than the installation surface of the exposure apparatus, and is connected to a portion of a first piping arrangement at which the liquid is directed from the object to the circulating device; wherein the removing pipe is connected to the tank.

18. A method for manufacturing a device comprising the step of:

transferring a pattern which is formed on the reticle onto the substrate by using the exposure system according to claim 17.

19. An exposure system which is provided with an exposure apparatus which projects and transfers an image of a pattern formed on a reticle held onto a reticle stage onto a substrate held on a substrate stage through an optical projection system, the system comprising:

a circulating device which is disposed under an installation surface of the exposure apparatus and circulates a liquid to at least one object among the reticle stage, the substrate stage, and the optical projection system through a circulation path so as to control a temperature of the object;

a tank which is open to the atmosphere and which contains the liquid therein, and is disposed higher than the installation surface of the exposure apparatus, and is connected through a first piping arrangement to a portion of the circulation path of the liquid at which the liquid is directed from the object to the circulating device; and a detecting section which detects a position of a surface of the liquid which is contained in the tank.

20. An exposure system according to claim 19, further comprising a notifying section which notifies a fluctuation of an amount of the liquid which is circulated in the circulation path based on a detection result of the detecting section.

21. A method for manufacturing a device comprising the step of:

transferring a pattern which is formed on the reticle onto the substrate by using the exposure system according to claim 19.

* * * * *